United States Patent
Lin et al.

(10) Patent No.: US 12,387,992 B2
(45) Date of Patent: Aug. 12, 2025

(54) PACKAGE AND METHOD FOR FORMING THE SAME

(71) Applicant: Taiwan Semiconductor Manufacturing Co., Ltd., Hsinchu (TW)

(72) Inventors: Yu-Sheng Lin, Zhubei (TW); Chien-Tung Yu, Hsinchu (TW); Chia-Hsiang Lin, Zhubei (TW); Chin-Hua Wang, New Taipei (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 415 days.

(21) Appl. No.: 17/828,691

(22) Filed: May 31, 2022

(65) Prior Publication Data
US 2023/0386951 A1 Nov. 30, 2023

(51) Int. Cl.
| | |
|---|---|
| H01L 23/31 | (2006.01) |
| H01L 21/48 | (2006.01) |
| H01L 21/56 | (2006.01) |
| H01L 21/683 | (2006.01) |
| H01L 23/00 | (2006.01) |
| H01L 23/538 | (2006.01) |
| H01L 25/00 | (2006.01) |
| H01L 25/065 | (2023.01) |

(52) U.S. Cl.
CPC ...... *H01L 23/3135* (2013.01); *H01L 21/4853* (2013.01); *H01L 21/4857* (2013.01); *H01L 21/563* (2013.01); *H01L 21/565* (2013.01); *H01L 21/6835* (2013.01); *H01L 23/3128* (2013.01); *H01L 23/5383* (2013.01); *H01L 23/5386* (2013.01); *H01L 24/16* (2013.01); *H01L 25/0655* (2013.01); *H01L 25/50* (2013.01); *H01L 2221/68359* (2013.01); *H01L 2224/16227* (2013.01); *H01L 2924/18161* (2013.01); *H01L 2924/351* (2013.01)

(58) Field of Classification Search
None
See application file for complete search history.

(56) References Cited

U.S. PATENT DOCUMENTS

| | | | | |
|---|---|---|---|---|
| 2008/0211111 | A1* | 9/2008 | Park | H01L 24/27 257/778 |
| 2012/0048607 | A1* | 3/2012 | Takahashi | H01L 21/563 174/260 |
| 2013/0062786 | A1* | 3/2013 | Leung | H01L 23/49811 438/106 |
| 2019/0103361 | A1* | 4/2019 | Raorane | H01L 23/3114 |
| 2019/0259633 | A1* | 8/2019 | Maehara | H10F 39/804 |
| 2021/0288025 | A1* | 9/2021 | Arvin | H01L 23/3121 |
| 2022/0301969 | A1* | 9/2022 | Noh | H01L 21/563 |

* cited by examiner

Primary Examiner — Cory W Eskridge
(74) Attorney, Agent, or Firm — Slater Matsil, LLP

(57) ABSTRACT

In an embodiment, a package including: a redistribution structure including a first dielectric layer and a first conductive element disposed in the first dielectric layer; a first semiconductor device bonded to the redistribution structure, wherein the first semiconductor device includes a first corner; and an underfill disposed over the redistribution structure and including a first protrusion extending into the first dielectric layer of the redistribution structure, wherein the first protrusion of the underfill overlaps the first corner of the first semiconductor device in a plan view.

20 Claims, 32 Drawing Sheets

PACKAGE AND METHOD FOR FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
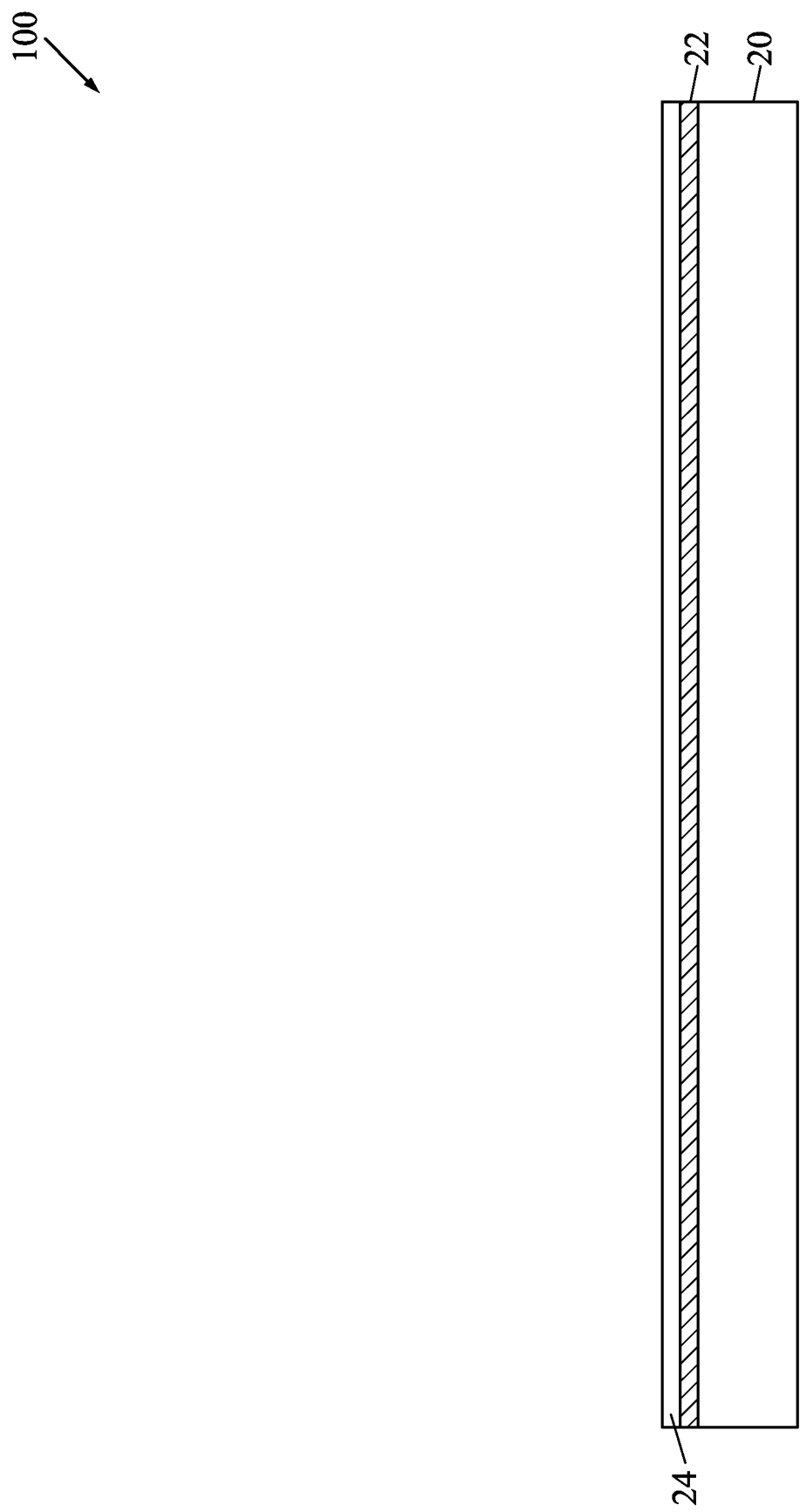
FIGS. 1-7, 8A, 8B, 9A, 9B, 10A, 11A, 11B, 12, and 15-21 illustrate cross-sectional views of intermediate stages during a process for forming a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including an underfill and the method of forming the same are provided in accordance with some embodiments. In accordance with some embodiments of the present disclosure, the underfill is disposed between a semiconductor device and a redistribution structure and laterally surrounds the semiconductor device in a plan view. The redistribution structure may have trenches so that underfill may flow into the trenches to form protrusions extending into the redistribution structure. The resulting structure of the underfill has reduced contact area with the semiconductor device and therefore may reduce the stress generated by the coefficient of thermal expansion (CTE) mismatch between the underfill and the semiconductor device. The reliability of the package may be improved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-7, 8A, 8B, 9A, 9B, 10A, 11A, 11B, 12, and 15-21 illustrate cross-sectional views of intermediate stages in the formation of packages in accordance with some embodiments. FIGS. 10B, 11C, 13A-13C, and 14A-14E illustrate plan views of intermediate stages in the formation of packages in accordance with some embodiments, wherein FIGS. 1-7, 8A, 9A, 9B, 10A, 11A, 12, and 16-21 are cross-sectional views according to a section X1-X1' as illustrated in FIG. 11C; FIG. 11B is a cross-sectional view according to a section X2-X2' as illustrated in FIG. 11C; and FIG. 15 is a cross-sectional view according to a section Y-Y' as illustrated in FIG. 14A.

FIGS. 1-7, 8A, 8B, 9A, 9B, 10A, 11A, 11B, and 12 illustrate the cross-sectional views of intermediate stages in the formation of a package 100 in accordance with some embodiments of the present disclosure, wherein FIGS. 1-9B illustrate the formation of a redistribution structure on a carrier. Referring first to FIG. 1, there is illustrated a carrier 20 and a release film 22 formed on carrier 20. The carrier 20 may be a glass carrier in accordance with some embodiments. The carrier 20 may have a round plan-view shape. The release film 22 may be formed of a Light-To-Heat-Conversion (LTHC) material, which may be decomposed, so that the overlying structures that will be placed on the carrier 20 in subsequent steps can be released from the carrier 20. In some embodiments, the release film 22 includes an epoxy-based thermal-release material. The release film 22 may be coated onto the carrier 20. The top surface of the release film 22 is substantially leveled and planar within process variations.

A dielectric layer 24 is formed on the release film 22 in accordance with some embodiments. The dielectric layer 24 may be formed of a polymer, which may be formed of or comprise polyimide (PI), polybenzoxazole (PBO), benzocyclobutene (BCB), a combination thereof, or the like. The dielectric layer 24 may also be formed of or comprise a non-polymer (inorganic material), which may be silicon oxide, silicon nitride, silicon oxynitride, or the like. The dielectric layer 24 may be formed by spin coating, lamination, CVD, the like, or a combination thereof.

Figure 2:
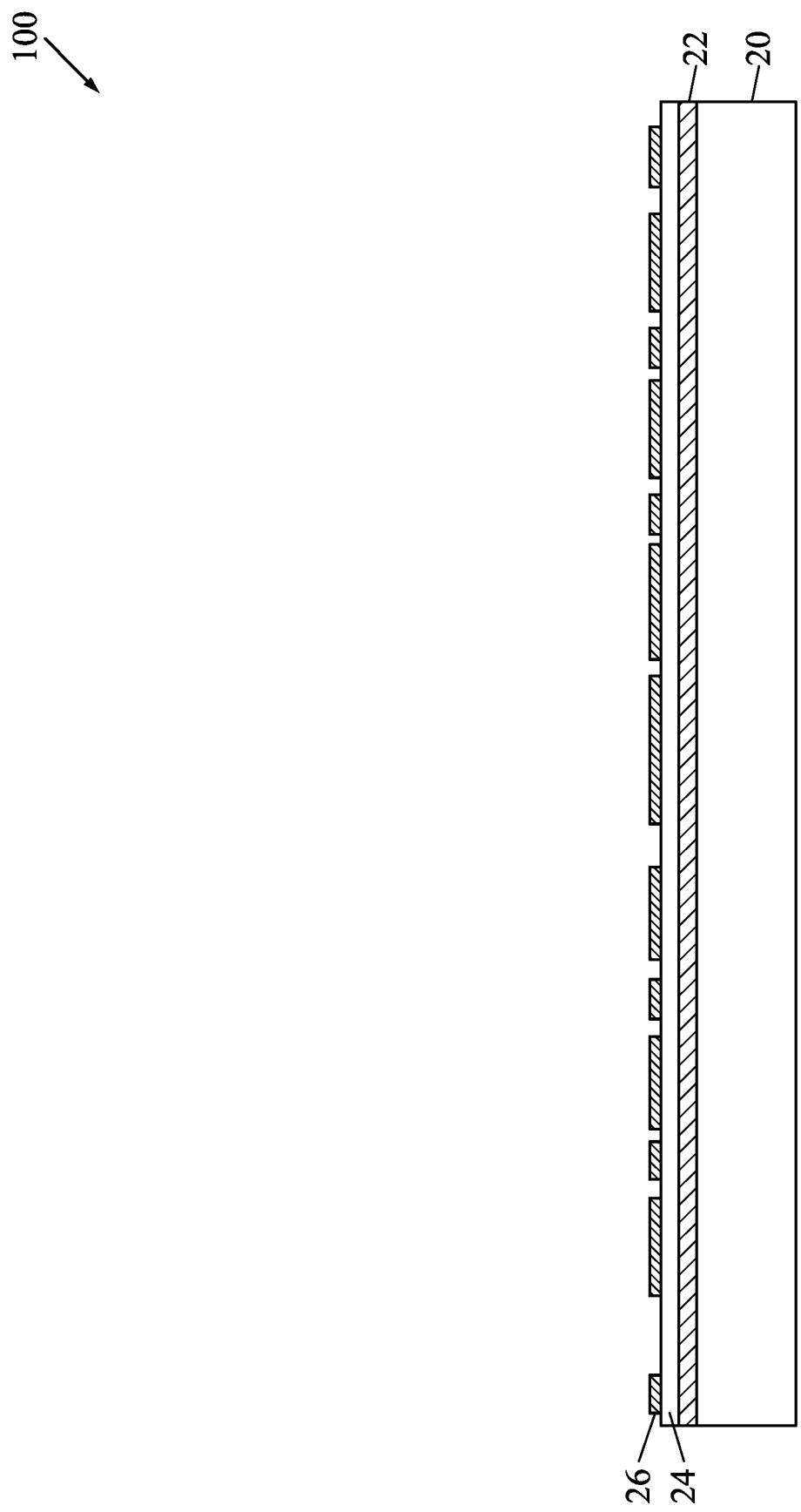

Referring to FIG. 2, redistribution lines (RDLs) 26 are formed over the dielectric layer 24 in accordance with some embodiments. The formation of RDLs 26 may include forming a seed layer (not shown) on the dielectric layer 24, forming a patterned mask (not shown) such as a photoresist on the seed layer, and then performing a metal plating process on the exposed seed layer to plate a metallic material. The patterned mask and the portions of the seed layer covered by the patterned mask are then removed, leaving the RDLs 26 as illustrated in FIG. 2. In some embodiments, the seed layer includes a titanium layer and a copper layer over the titanium layer. The seed layer may be formed using, for example, Physical Vapor Deposition (PVD). The plating may be performed using, for example, electrochemical plating. The plated metallic material may include a metal or a metal alloy, including copper, aluminum, tungsten, or the like. The RDLs 26 may include metal pads for landing Under-bump Metallurgies (UBMs), and metal traces for routing electrical signals, power, or the like.

Figure 3:
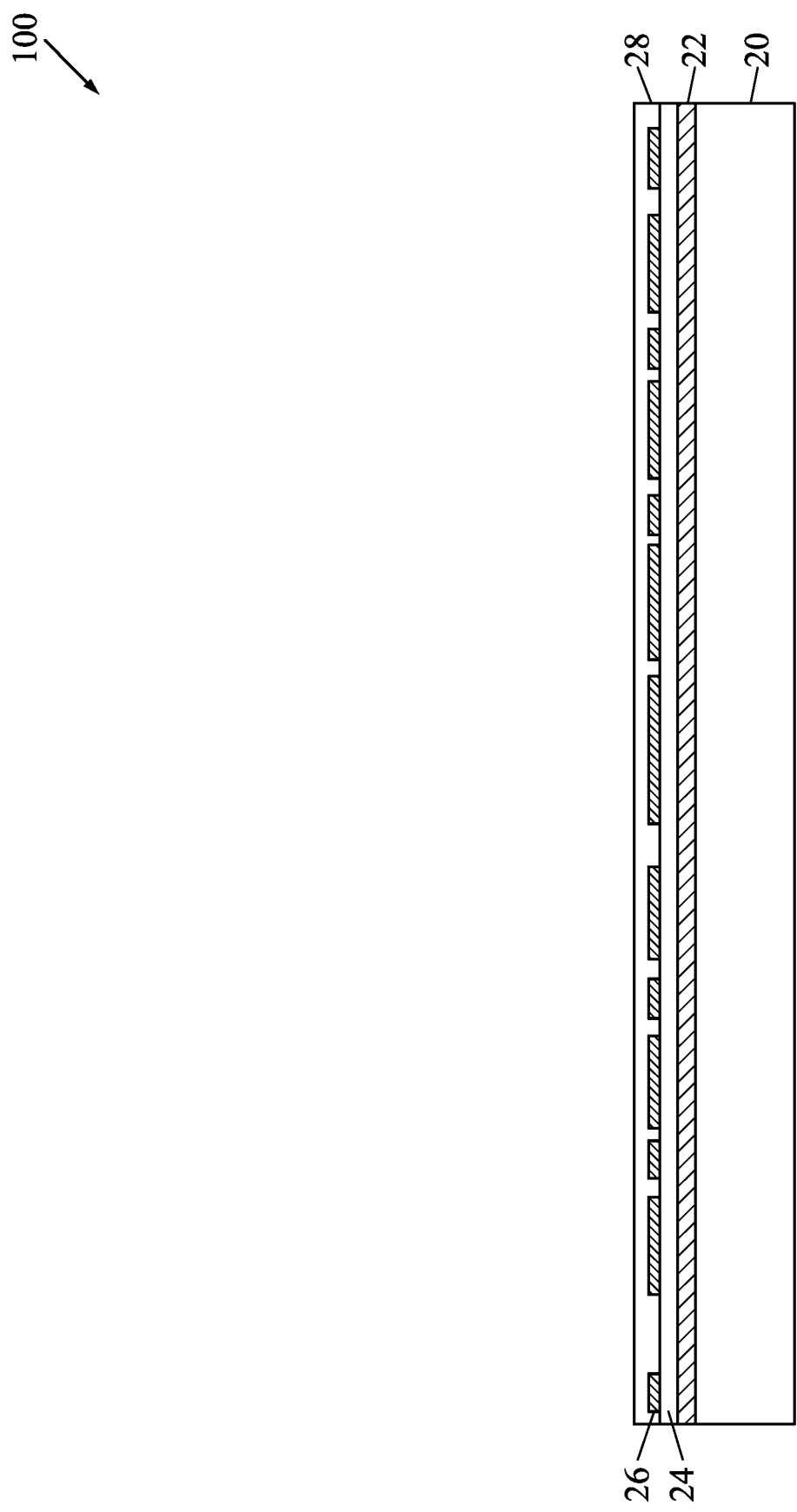

Referring to FIG. 3, a dielectric layer 28 is formed on the RDLs 26 and the dielectric layer 24. The bottom surface of dielectric layer 28 may be in contact with top surfaces of the RDLs 26 and the dielectric layer 24. In some embodiments, the dielectric layer 28 may be formed using similar processes and materials as used to form the dielectric layer 24.

Figure 4:
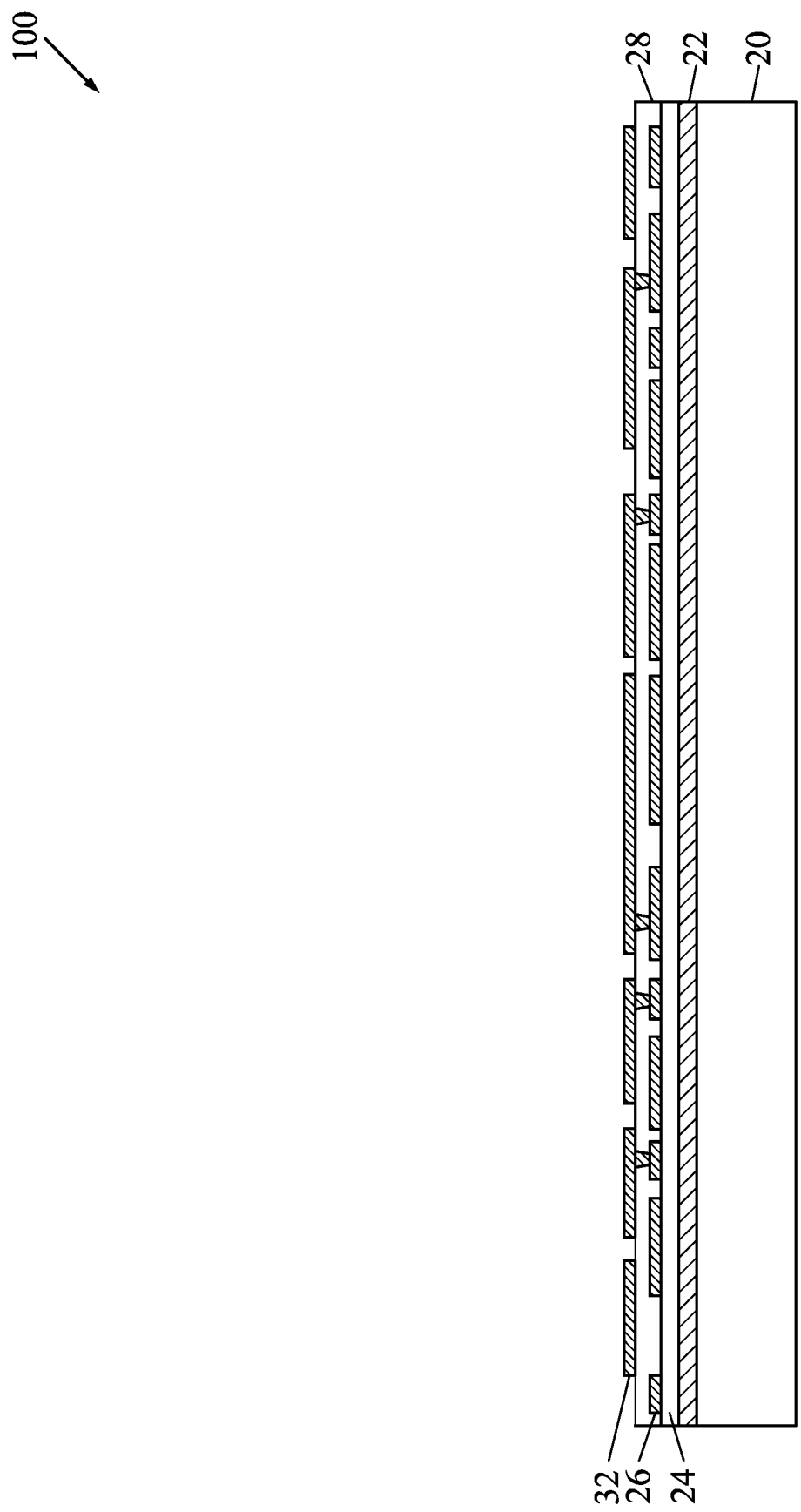

Referring to FIG. 4, RDLs 32 are formed to connect to the RDLs 26. The RDLs 32 include metal traces (metal lines) on the dielectric layer 28. The RDLs 32 also include vias extending into the dielectric layer 28. In some embodiments, the dielectric layer 28 is patterned to form openings therein. For example, in some embodiments the dielectric layer 28 is formed of a photosensitive material, which may be patterned using photolithography techniques and then cured. As another example, the dielectric layer 28 may be formed of a non-photosensitive material and patterned by forming and patterning a mask (e.g., a photoresist mask) and etching. Hence, some portions of the RDLs 26 are exposed through the openings in the dielectric layer 28. The RDLs 32 are then formed in a plating process using a patterned mask (e.g., a patterned photoresist layer), wherein each of RDLs 32 includes a seed layer (not shown) and a plated metallic material on the seed layer. The patterned mask and the seed layer under the patterned mask may be removed using an etch process. The materials of the seed layer and the plated metallic material may be selected from the same candidate materials of the seed layer and the plated metallic material, respectively, in the RDLs 26.

Figure 5:
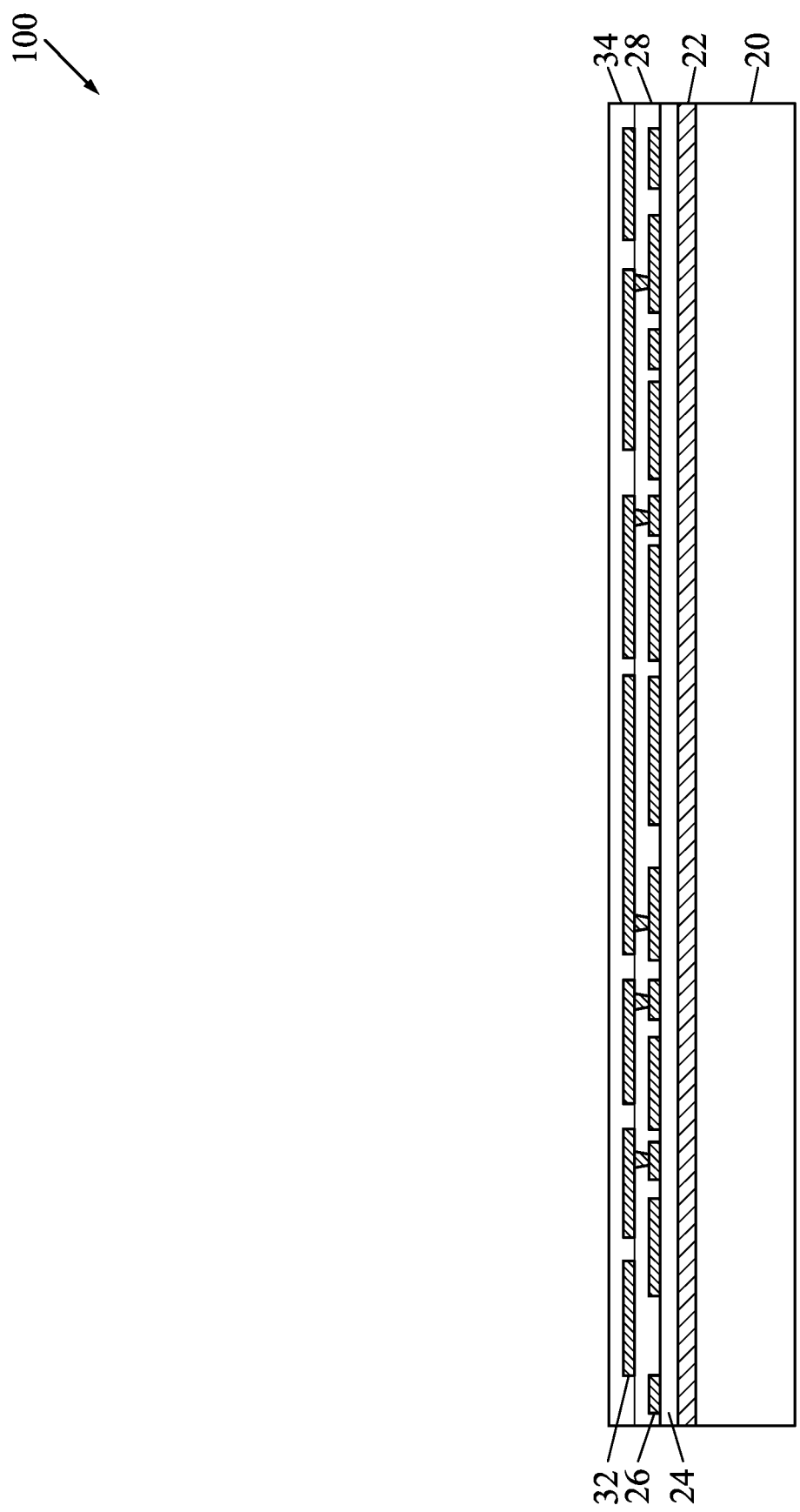

Referring to FIG. 5, a dielectric layer 34 is formed on the RDLs 32 and the dielectric layer 28. The bottom surface of dielectric layer 34 may be in contact with top surfaces of the RDLs 32 and the dielectric layer 28. In some embodiments, the dielectric layer 34 may be formed using similar processes and materials as used to form the dielectric layer 24.

Figure 6:
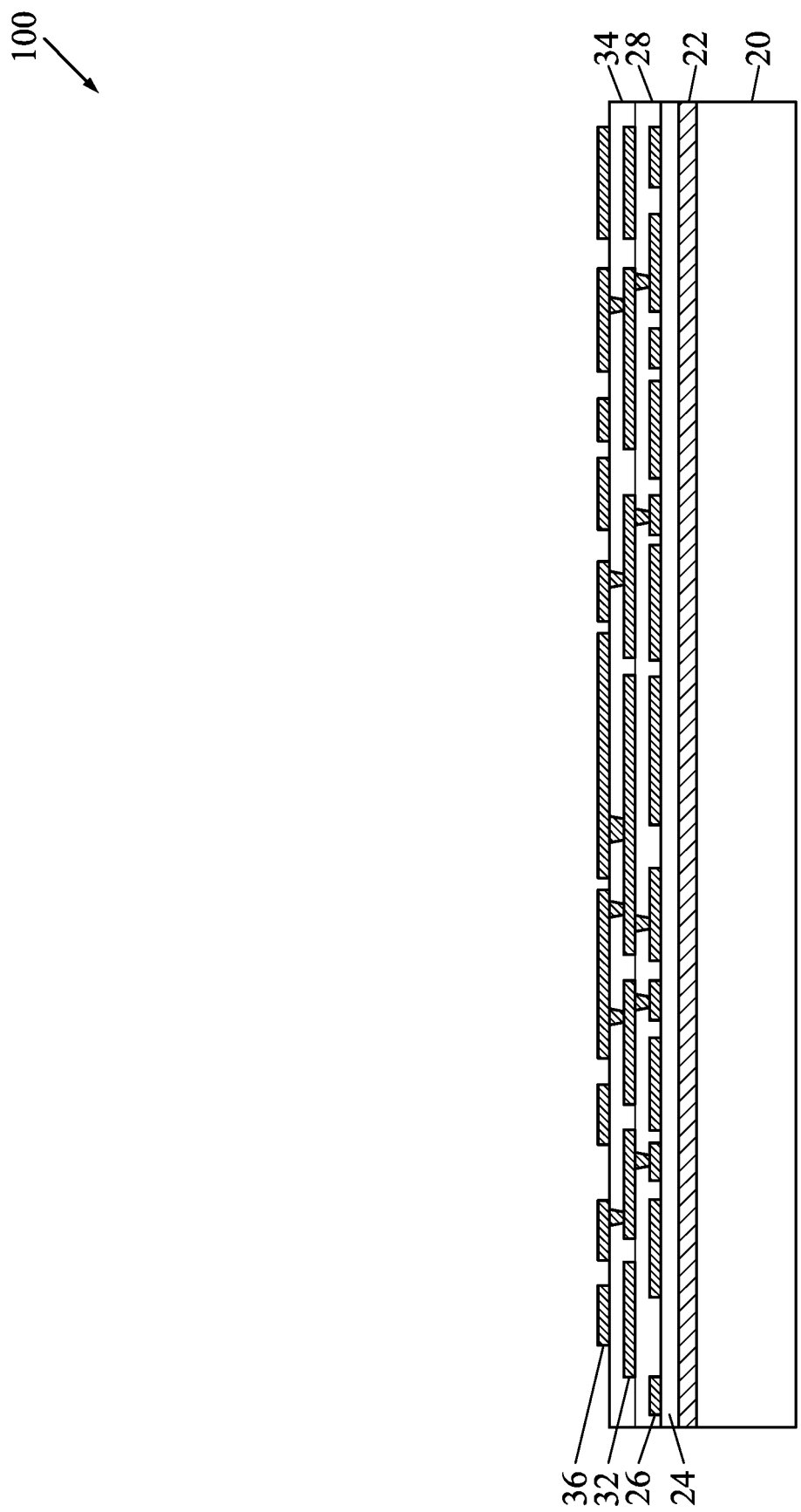

FIG. 6 illustrates the formation of RDLs 36 in accordance with some embodiments. The formation of RDLs 36 may adopt methods and materials similar to those for forming the RDLs 32. It is appreciated that although in the illustrative example embodiments, three dielectric layers 24, 28, 34 and the respective RDLs 26, 32, 36 formed therein are discussed, fewer or more dielectric layers and RDL layers may be adopted, depending on the routing requirement and the requirement of using polymers for buffering stress. For example, there may be two dielectric layers or four, five, or more dielectric layers and the corresponding RDL layers.

Figure 7:
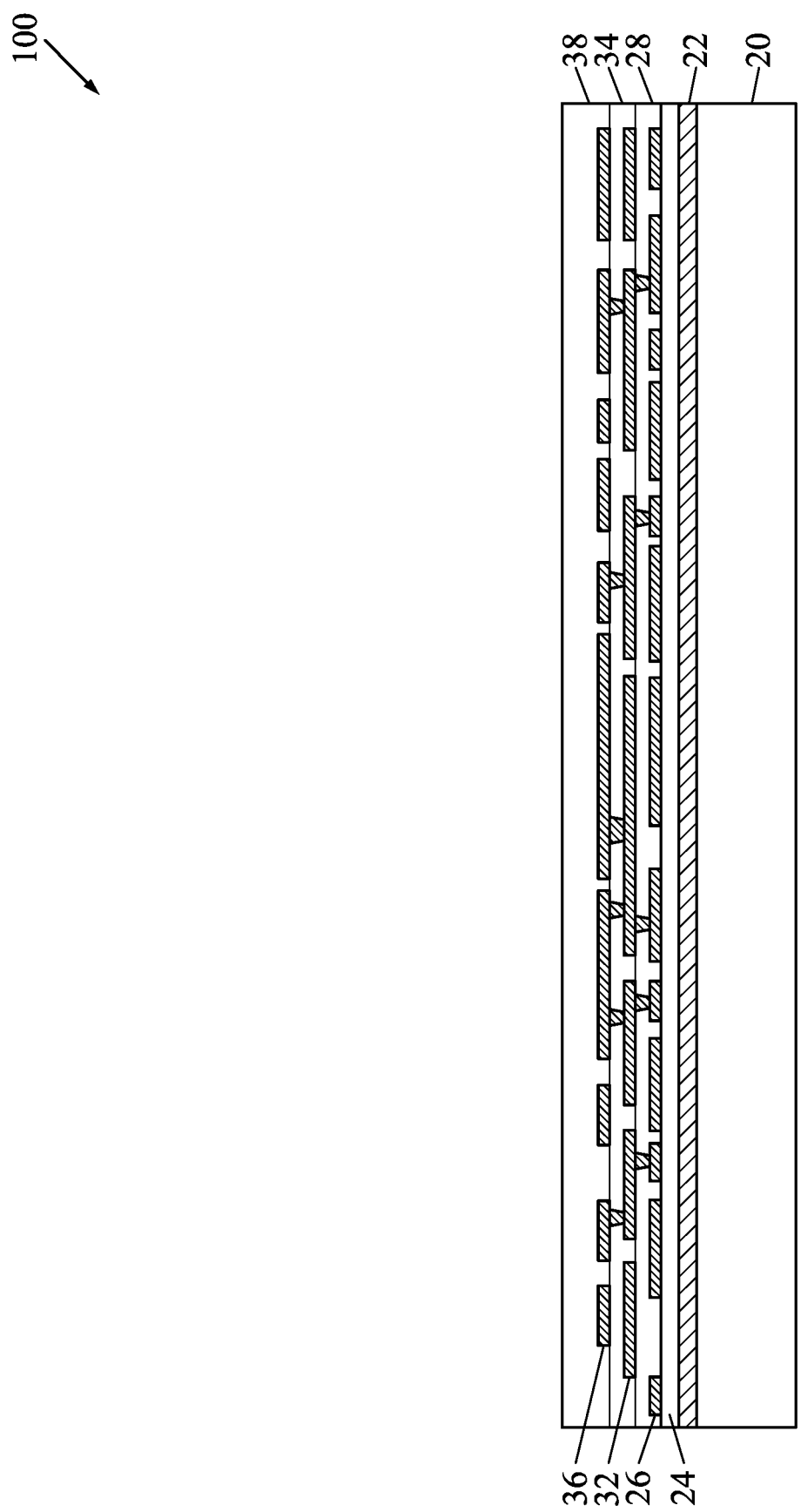

Referring to FIG. 7, a dielectric layer 38 is formed on the RDLs 36 and the dielectric layer 34. In accordance with some embodiments of the present disclosure, the dielectric layer 38 is formed of a polymer, which may be PI, PBO, BCB, or the like. The dielectric layer 38 may be formed by spin coating, lamination, CVD, the like, or a combination thereof. The dielectric layer 38 may have a thickness of about 1 um to about 10 um.

Figure 8A:
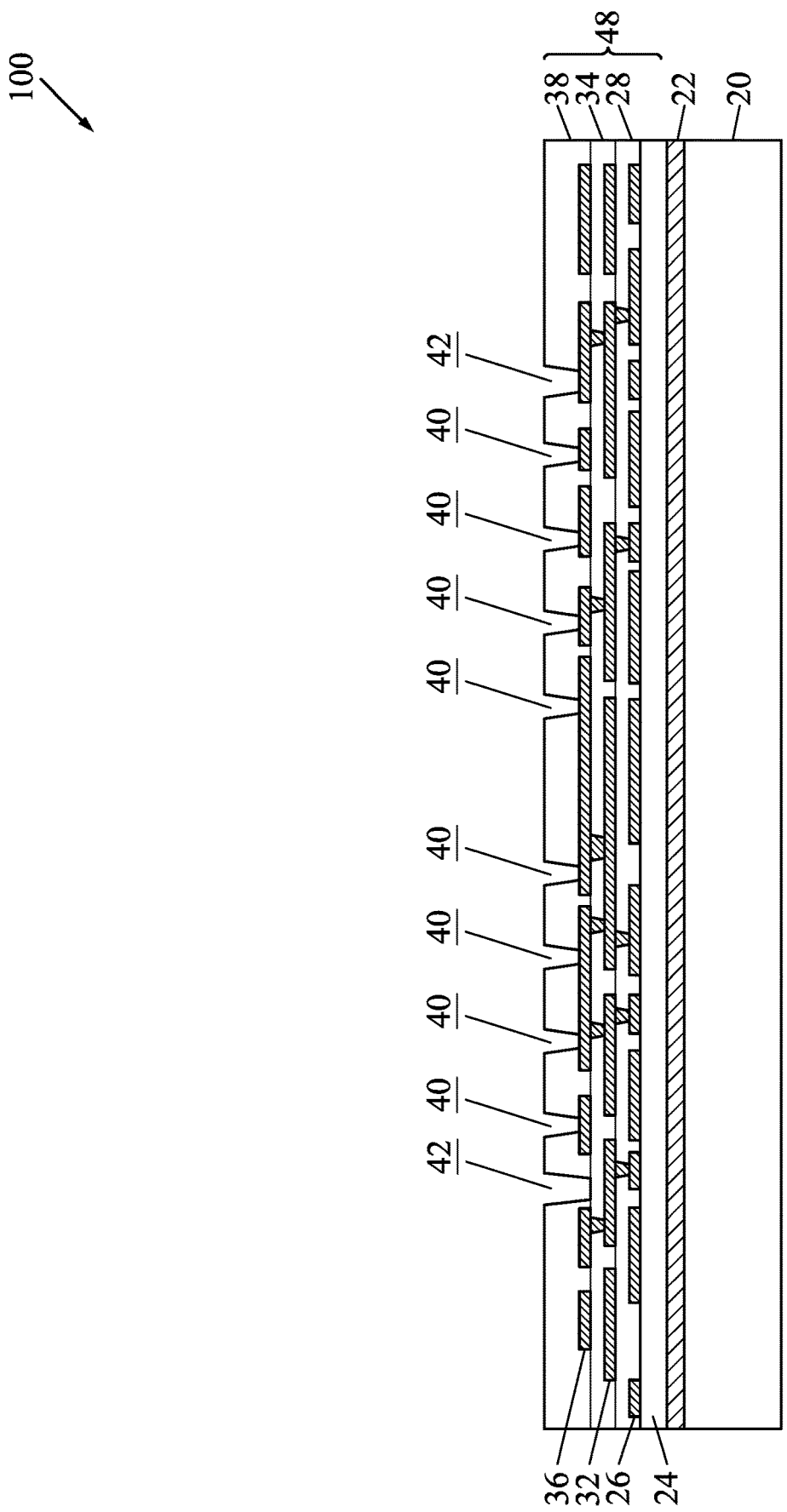

Referring to FIG. 8A, openings 40 and trenches 42 are formed in the dielectric layer 38 in accordance with some embodiments. The openings 40 and the trenches 42 may be recessed from a top surface of the dielectric layer 38. The openings 40 may reveal the underlying RDLs 36 and may be used to make an electrical connection to the underlying RDLs 36 in subsequent processes. The trenches 42 may also reveal the underlying RDLs 36, such as the trench 42 on the right of FIG. 8A. However, the trenches 42 may reveal the dielectric layer 34 only, such as the trench 42 on the left of FIG. 8A, or portions of the RDLs 36 and the dielectric layer 34. As discussed in greater detail below, electrical contacts will be formed in the openings 40, and semiconductor devices (e.g., integrated circuit dies, package dies, integrated devices, integrated passive devices, or the like) may be connected to those electrical contacts to provide electrical connections to the underlying RDLs 36 for routing of electrical signals. The trenches 42 will be subsequently filled with an underfill material. The underfill and the semiconductor devices have the CTE mismatch and would generate high stress in subsequent manufacturing and operating processes. The high stress may occur in some areas, such as areas around vertical edges of a semiconductor device and/or where the underfill is prone to excessively accumulate (e.g., entrances of gaps between adjacent semiconductor devices due to capillary action). In some embodiments, the trenches 42 are located in these high-stress areas in accordance with some embodiments. As such, the trenches 42 may reduce the height of the underfill relative to the semiconductor devices, and as a result, the underfill and the semiconductor devices may have reduced contact area in these high-stress areas, thereby reducing the stress caused by the CTE mismatch and reducing the risks of damaging the semiconductor devices.

Figure 8B:
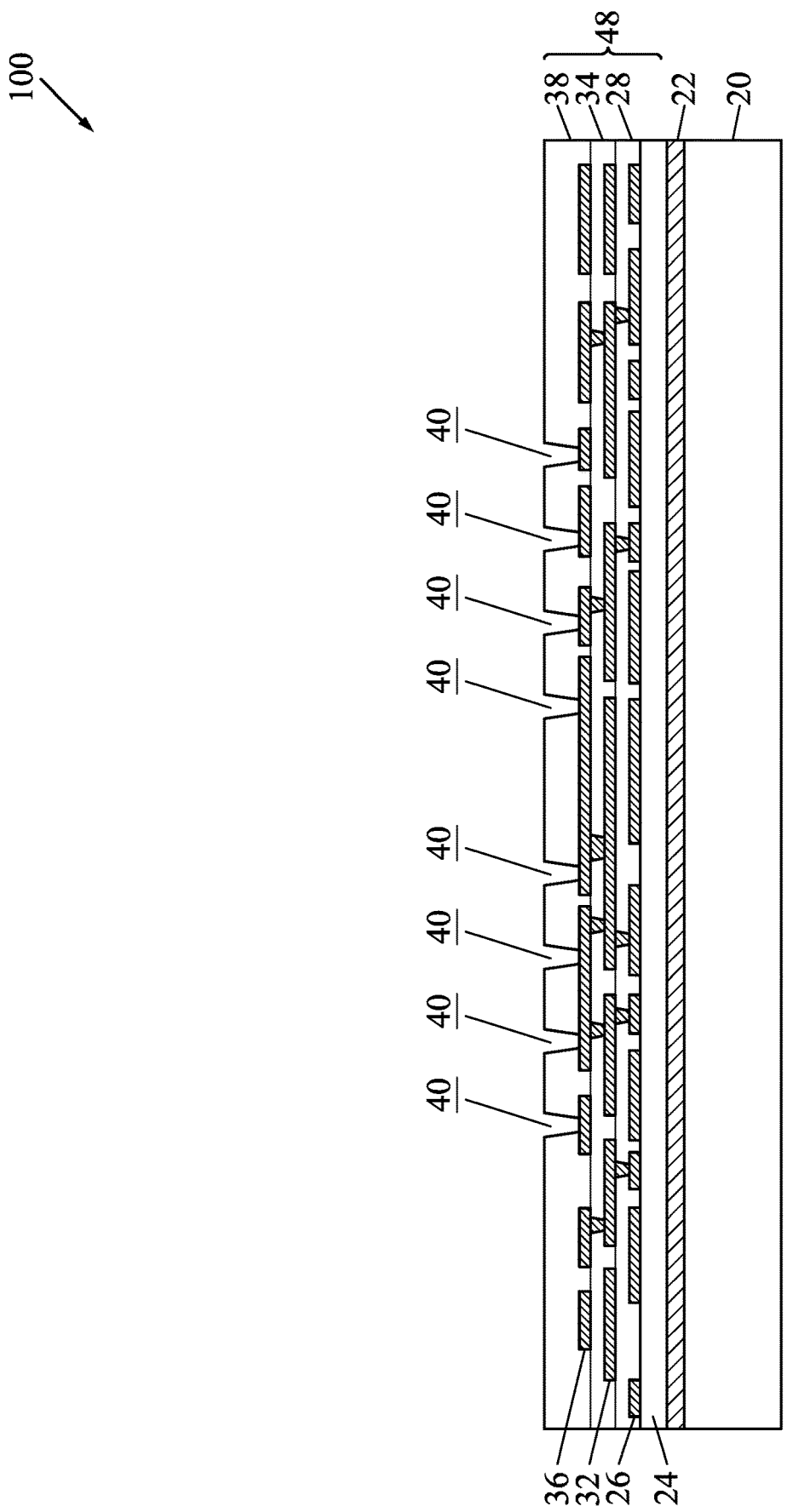

The openings 40 and the trenches 42 are formed in a same process in accordance with some embodiments. For example, when the dielectric layer 38 is a photosensitive material, the formation of openings 40 and trenches 42 may include performing a light-exposure process on dielectric layer 38 using a lithography mask that includes a pattern of openings 40 and trenches 42 and then performing a developing process. In such a case, depth of the formed trenches 42 may be deeper than or equal to depth of the formed opening 40, because the RDLs 36 underlying the opening 40 are not lost by the light-exposure process. In some embodiments, the openings 40 and the trenches 42 are formed in separate processes. For example, referring to FIG. 8B, the openings 40 may be formed by a first light-exposure process using a first lithography mask. Then, the trenches 42 may be formed by a second light-exposure process using a second lithography mask, followed by a developing process so that a structure as illustrated in FIG. 8A may be obtained. Although FIG. 8B shows the first light-exposure process is performed first, the sequence of the first light-exposure process and the second light-exposure process may be switched. In some embodiments, the dielectric layer 38 is cured after the openings 40 and the trenches 42 are formed. The plan-view shape of the trenches 42 may include a square, rounded square, a rectangular shape, a rounded rectangular shape, an oval shape, an irregular shape, a combination thereof, or a like.

Figure 9A:
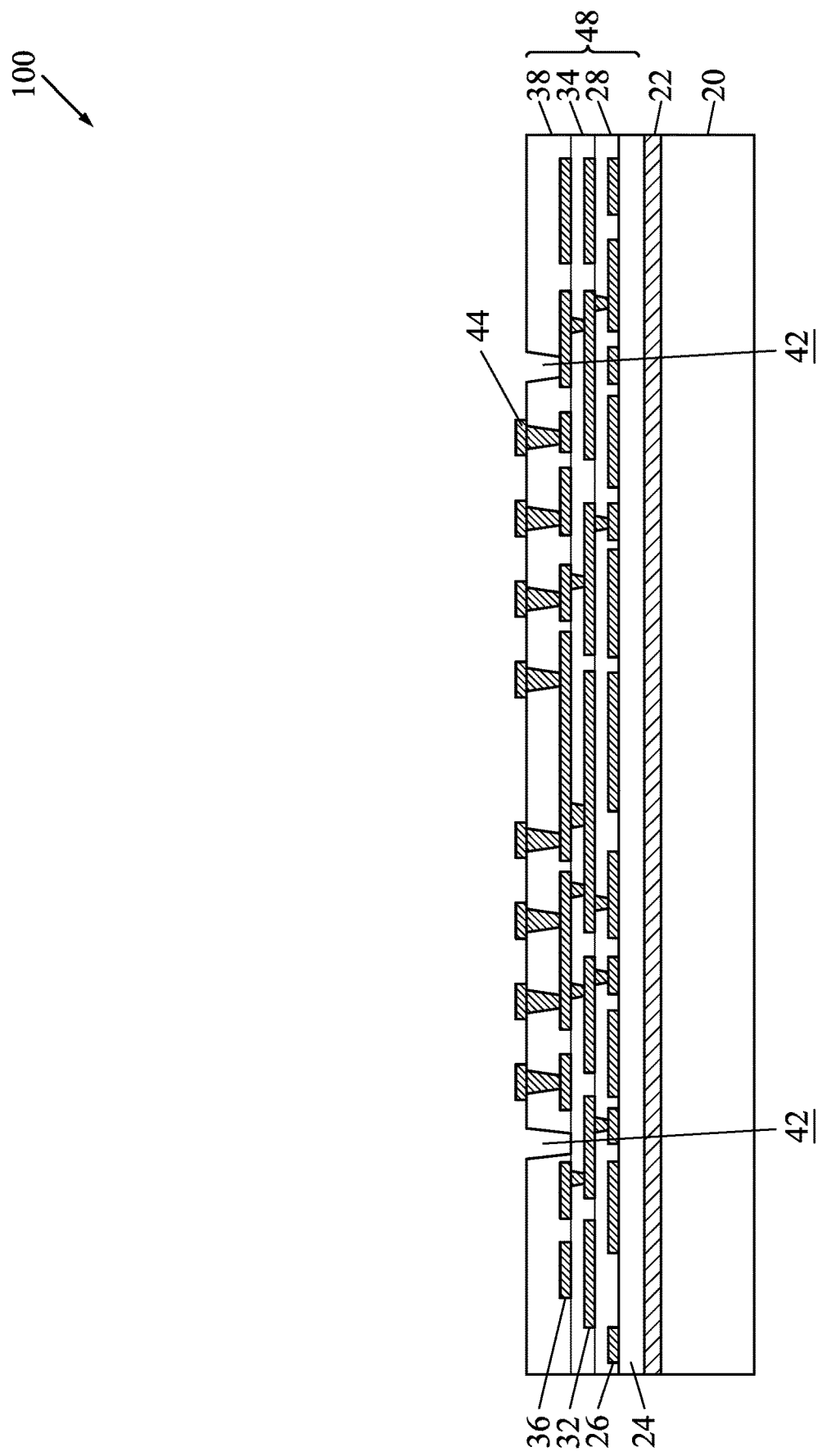
Figure 9B:
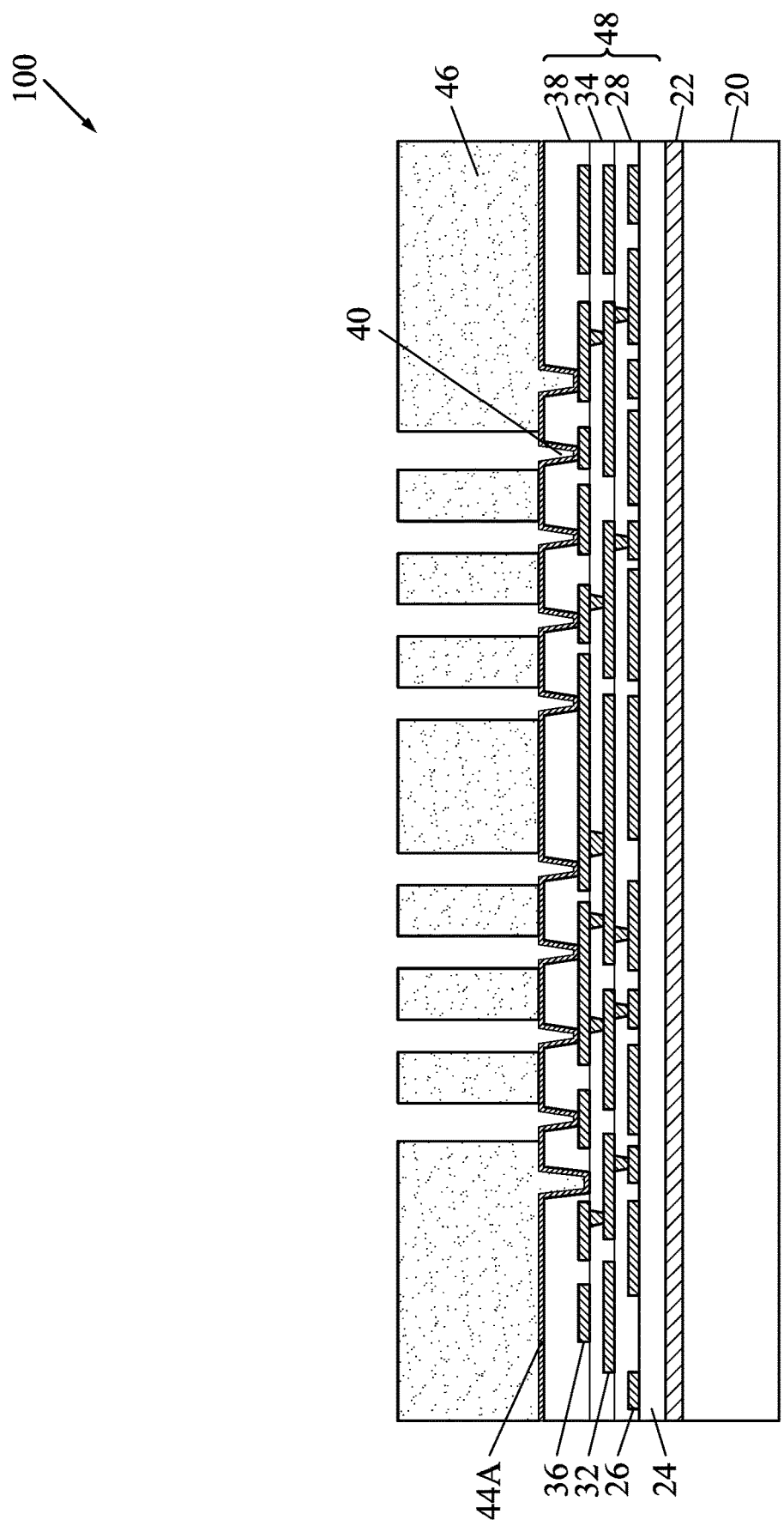

Referring to FIG. 9A, conductive elements 44 (seed layer not separately shown) are formed in the openings 40 in accordance with some embodiments. The conductive elements 44 may protrude over the top surface of the dielectric layer 38. The conductive elements 44 may be under bump metallurgies (UBMs) and may also have routing functions like RDLs. In some embodiments, referring to FIG. 9B, the formation process of the conductive elements 44 includes forming a blanket metal seed layer 44A in the openings 40 and on the top surface of the dielectric layer 38, and then forming a patterned mask 46 such as a photoresist over the metal seed layer 44A with openings corresponding to a desired pattern of the conductive elements 44. A plating process on exposed portions of the metal seed layer 44A may be performed to plate a metallic material. The patterned mask 46 and the portions of the metal seed layer 44A covered by the patterned mask 46 are then removed, leaving the conductive elements 44 (e.g., see FIG. 9A). In some embodiments, the patterned mask 46 may be removed by an acceptable ashing or stripping process, such as using an oxygen plasma or the like. In some embodiments, the metal seed layer 44A includes a titanium layer and a copper layer over the titanium layer. The plated metallic material may include a metal or a metal alloy, including copper, aluminum, tungsten, or the like. The metal seed layer may be formed using, for example, PVD. The plating may be performed using, for example, electrochemical plating. In some embodiments, the dielectric layers 24, 28, 34, 38, the RDLs 26, 32, 36, and the conductive elements 44 are collectively referred to as a redistribution structure 48.

Figure 10A:
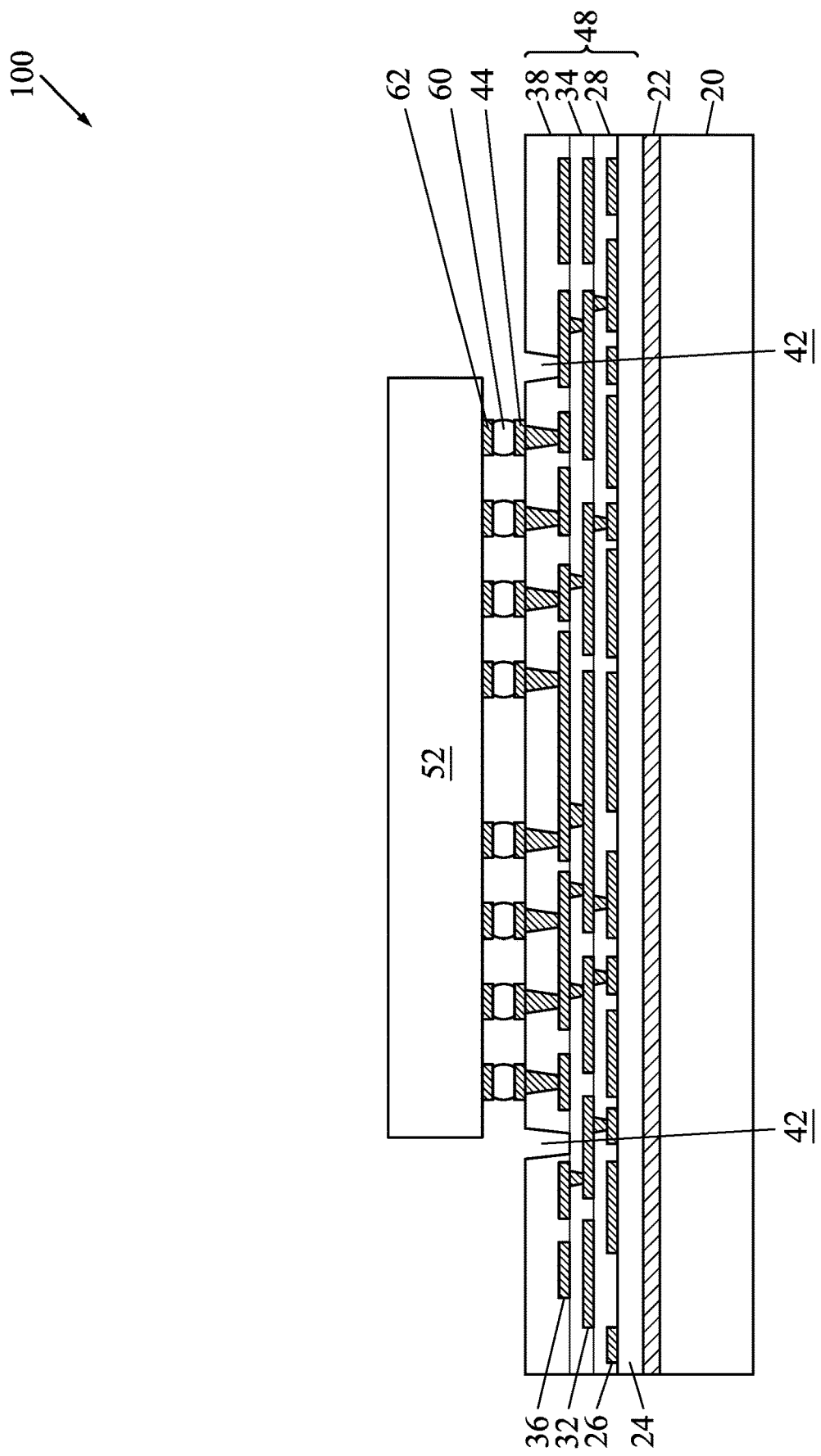
Figure 10B:
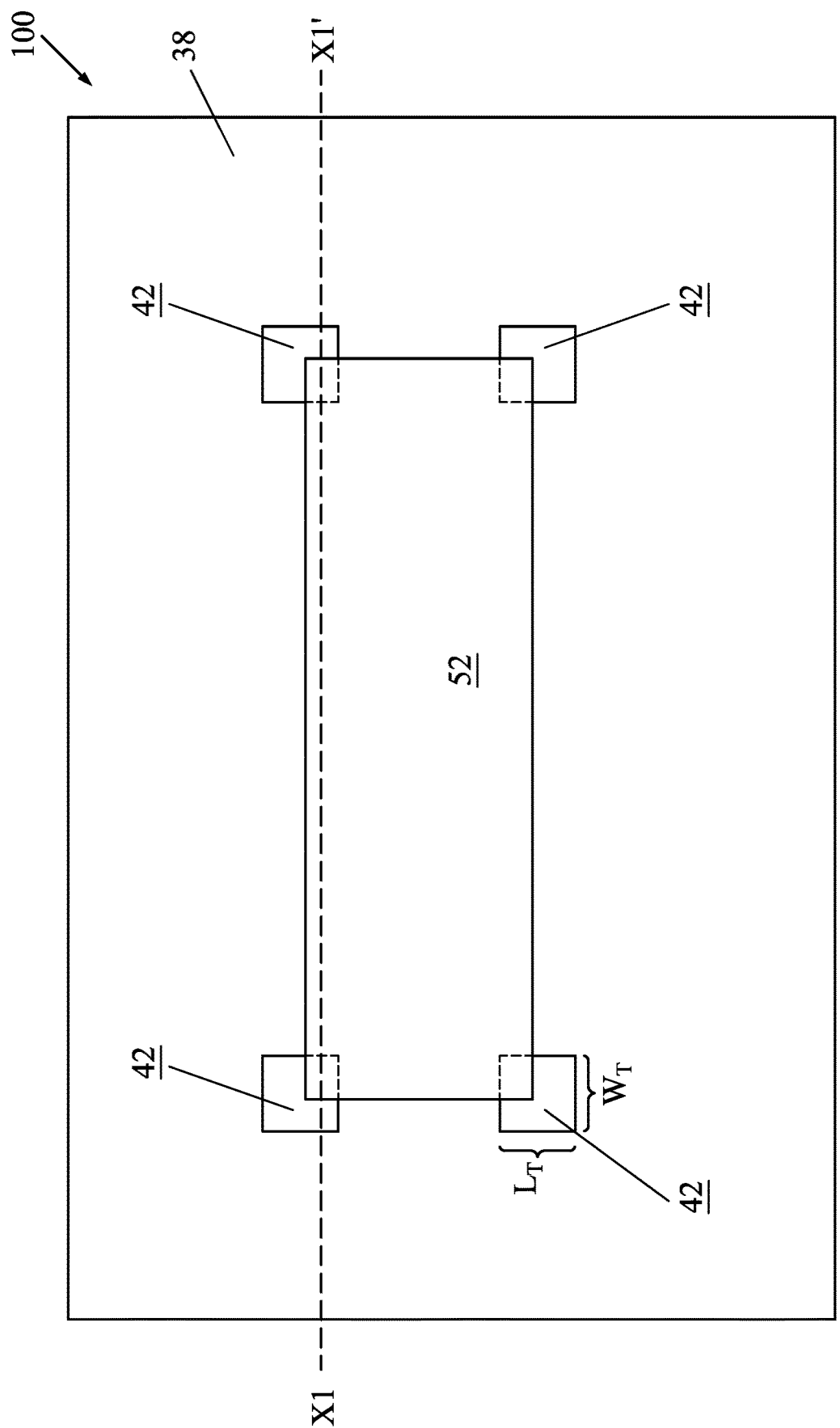
FIGS. 10B, 11C, 13A-13C, and 14A-14E illustrate plan views of intermediate stages during a process for forming a package in accordance with some embodiments.

Next, as illustrated in FIGS. 10A and 10B, one or more semiconductor devices (e.g., integrated circuit dies, package dies, integrated devices, integrated passive devices, or the like) are bonded to the redistribution structure 48 in accordance with some embodiments. FIG. 10A shows a cross-sectional view according to the section X1-X1' in the plan view of the package 100 as illustrated in FIG. 10B. In some embodiments, a first semiconductor device 52 is bonded to the redistribution structure 48. The first semiconductor device 52 may be an integrated circuit device, a package device, an integrated device, an integrated passive device, or the like, and in some embodiments the first semiconductor device 52 may be a die, a stack of a plurality of dies, or the like. For example, the first semiconductor device 52 may be a logic device, a memory device, a device stack thereof, or the like. In accordance with some embodiments, the logic device is a system-on-a-chip (SoC), a Central Processing Unit (CPU) device, a graphic processing unit (GPU) device, a Micro Control Unit (MCU) device, a BaseBand (BB) device, an Application processor (AP) device, stacks thereof, or the like. Although not shown in FIGS. 10A and 10B, more semiconductor devices (e.g., second to ninth semiconductor devices 54A-54D, 56A-56D as illustrated in FIGS. 13A-14E, see below) may also be bonded on the redistribution structure 48.

In some embodiments, the bonding of the first semiconductor device 52 and the redistribution structure 48 are through conductive bumps 60, such as through solder bumps joining the conductive elements 44 to metal pads (or micro bumps) 62 of the first semiconductor device 52. In accordance with some embodiments, other types of bonding methods, such as hybrid bonding, direct metal-to-metal bonding, or the like, may be used.

In some embodiments, the first semiconductor device 52 is arranged such that the trenches 42 are located below areas of high stress, such as the corners of the first semiconductor device 52. For example, as illustrated in FIG. 10B, each of the trenches 42 may overlap at least two sidewalls of the first semiconductor device 52 in the plan view. The trenches 42 may have a plan-view shape of square, rectangle, circle, oval, or the like. In some embodiments the trenches 42 are in a rectangular shape, each of the trenches 42 has a length $L_T$, such as 0.5 to 10 um, and a width $W_T$, such as 0.5 to 10 um. In some embodiments, an area of trenches 42 under the first semiconductor device 52 is about ⅛ or less of an overall area of the first semiconductor device 52.

Figure 11A:
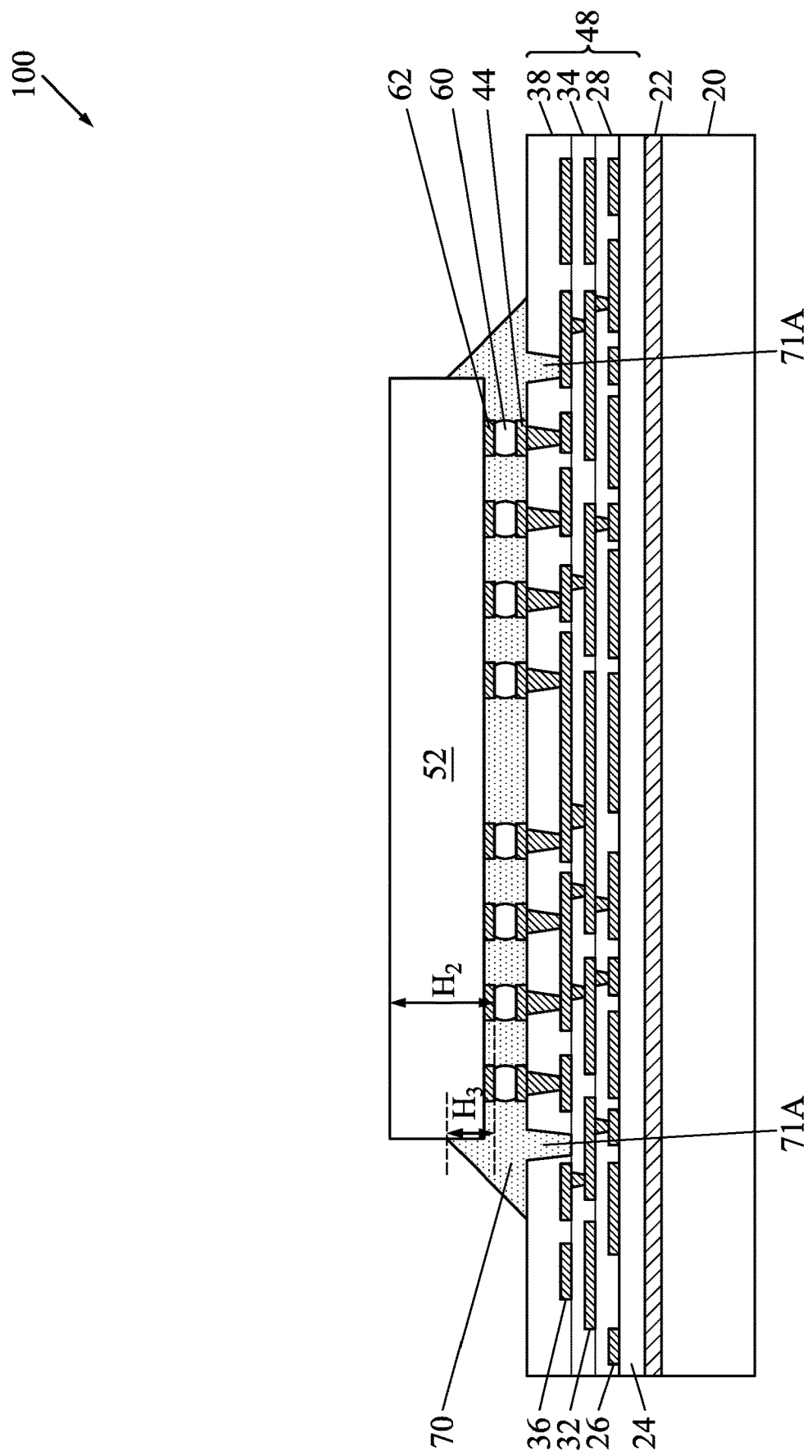
Figure 11B:
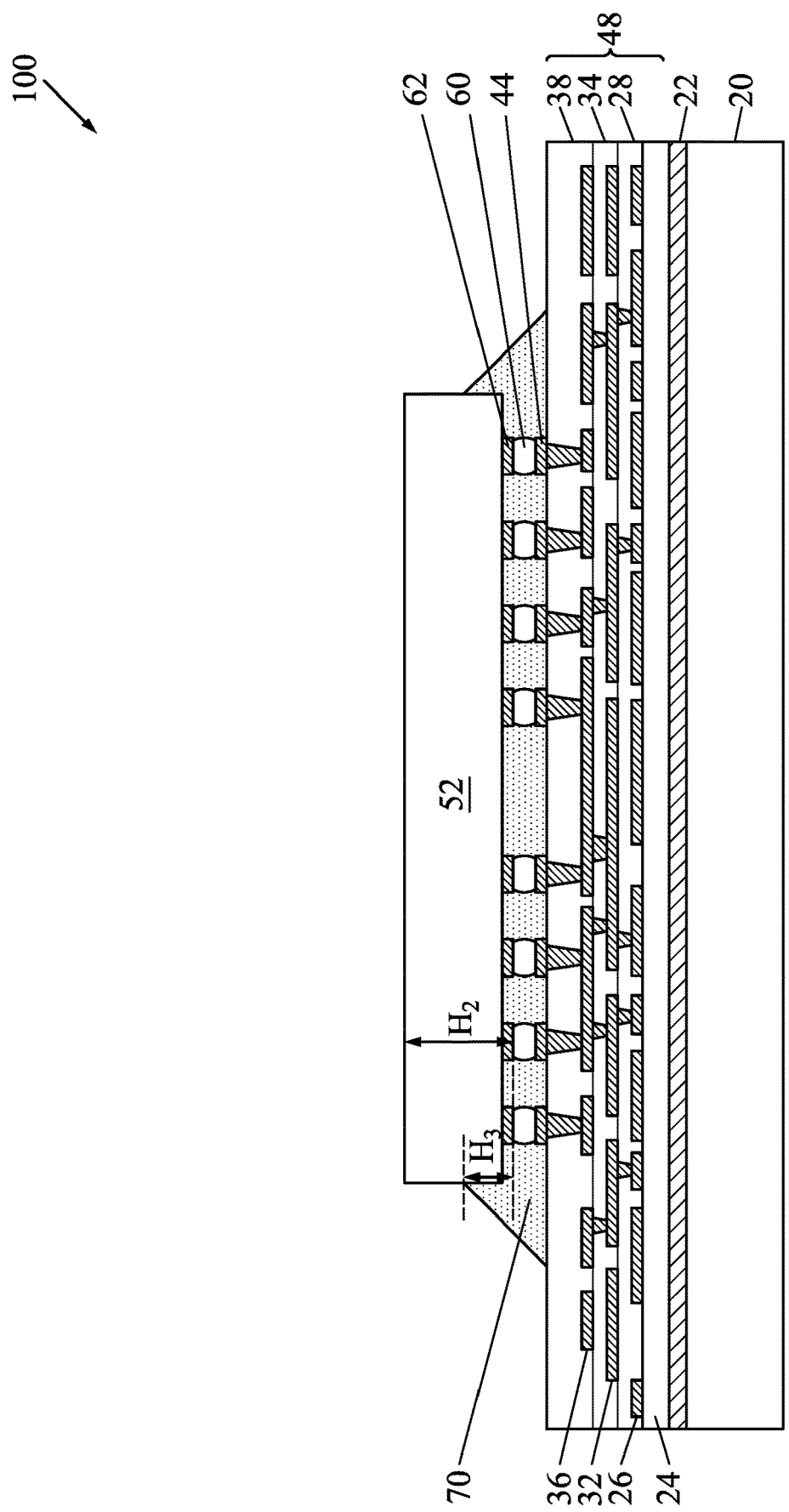
Figure 11C:
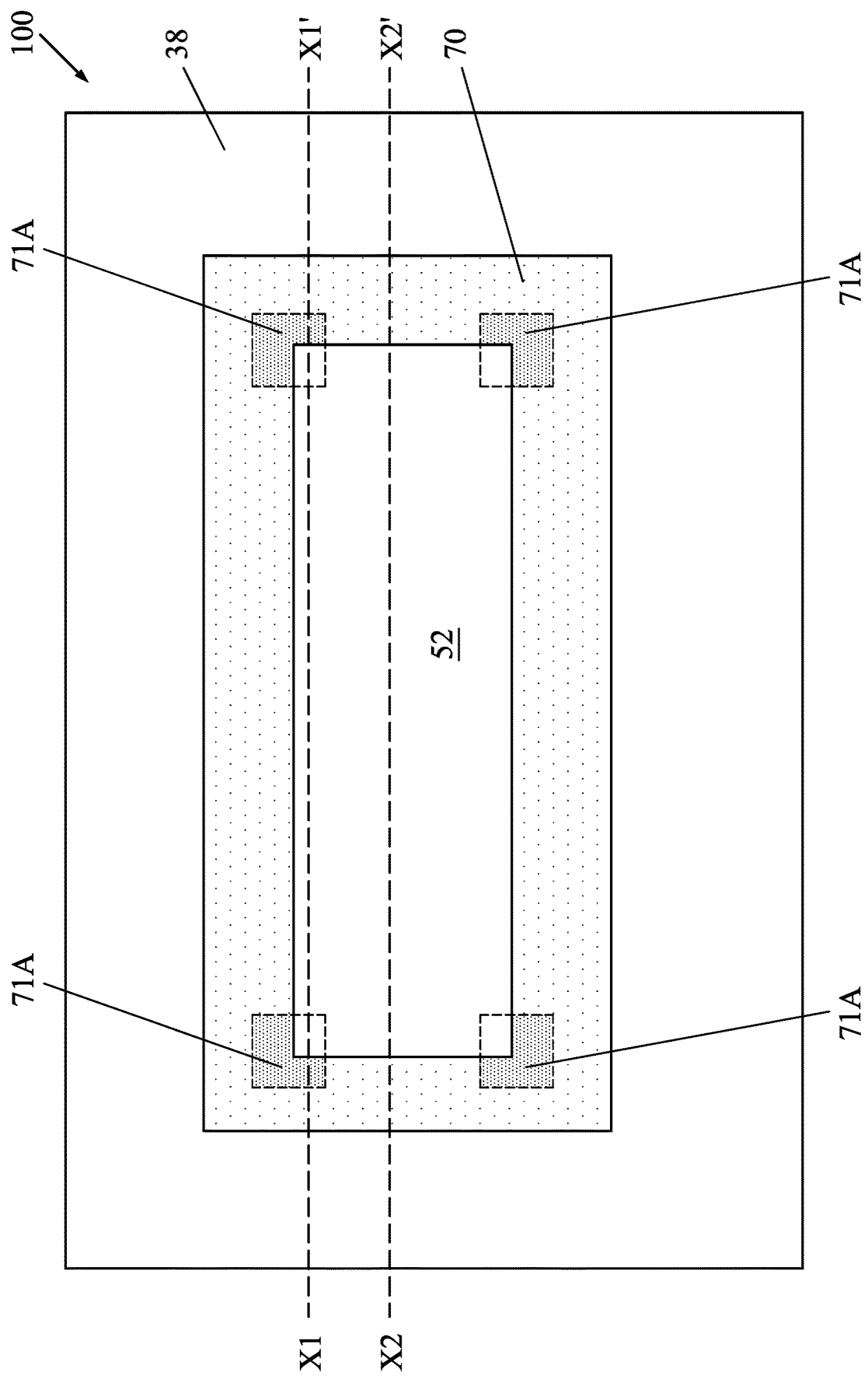

FIGS. 11A-11C illustrate forming an underfill 70 on the redistribution structure 48 in accordance with some embodiments. FIG. 11A shows a cross-sectional view according to the section X1-X1' in the plan view of the package 100 as illustrated in FIG. 11C, and FIG. 11B shows a cross-sectional view according to the section X2-X2' in the plan view of the package 100 as illustrated in FIG. 11C. In some embodiments, the underfill 70 laterally surrounds the first semiconductor device 52 in a plan view and partially covers each sidewall of the first semiconductor device 52. The underfill 70 may be dispensed in a flowable form and then cured. As such, the underfill 70 flows into the gap between the first semiconductor device 52 and the redistribution structure 48 to laterally surround the conductive bumps 60. The underfill 70 may protect the joints resulting from the reflowing of the conductive bumps 60. In some embodiments, the underfill 70 may be, for example, epoxy resins and fillers (e.g., silica).

In some embodiments, the underfill 70 also flows into the trenches 42 in the dielectric layer 38 and fills the trenches 42, thereby forming protrusions 71A of underfill 70 that extend into the dielectric layer 38 of the redistribution structure 48. The protrusions 71A of underfill 70 may be in contact with the RDLs 36 when the RDLs 36 are revealed by the trenches 42. Because the trenches 42 provide a lower bottom level and extra space for the underfill 70 to fill, a portion of the underfill 70 located on the protrusions 71A may have a reduced height relative to the first semiconductor device 52. For example, referring to FIGS. 11A and 11C, the top surface of a portion of the underfill 70 located on a vertical edge of the first semiconductor device 52 and directly on the protrusions 71A of the underfill 70 has a height H1 from the bottom surface of the first semiconductor device 52. The height H1 is, for example, 50 to 600 um. Also, as illustrated in FIGS. 11B and 11C, the top surface of a portion of the underfill 70 located on a vertical edge of the first semiconductor device 52 and not on the protrusion 71A (e.g., offset from the protrusions 71A in the plan view) has a height H3 from the bottom surface of the first semiconductor device 52. The height H3 may be 100 μm to 700 μm. In some embodiments, the height H1 is smaller than the height H3, such as more than 0.1 and less than 0.95 of the height H3.

The reduced height of the underfill 70 in high-stress areas reduces the contact area between the underfill 70 and the first semiconductor device 52 and therefore may reduce the stress generated by the CTE mismatch between the underfill 70 and the first semiconductor device 52. Accordingly, with forming the trenches 42 and filling them with protrusions 71A of the underfill 70 in the high-stress areas, such as the areas at or adjacent to the corners of the first semiconductor device 52 in the present embodiment, the risks of generating high stress that could damage the first semiconductor device 52 is reduced or prevented. The reliability of the package 100 may be improved.

Figure 12:
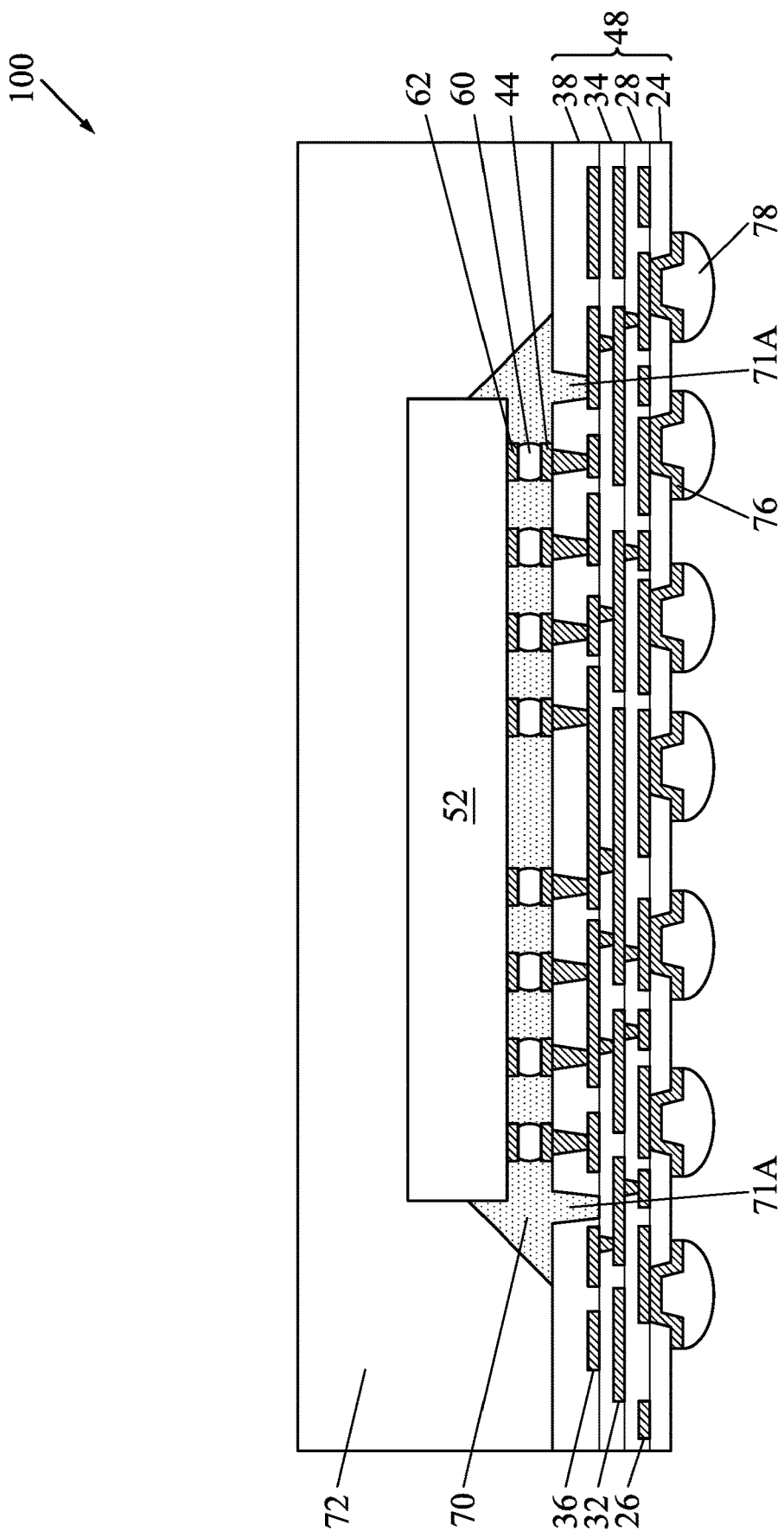

Referring to FIG. 12, an encapsulant 72 is dispensed and cured for encapsulation in accordance with some embodiments. The encapsulant 72 may be disposed on the underfill 70 and cover the first semiconductor device 52. When formed of a molding compound, encapsulant 72 may include a base material, which may be a polymer, a resin, an epoxy, or the like, and filler particles in the base material. The filler particles may be dielectric particles of $SiO_2$, $Al_2O_3$, or the like, and may have spherical shapes. Also, the spherical filler particles may have a plurality of different diameters. In some embodiments, the first semiconductor device 52 may be exposed through the encapsulant 72 by either a planarization process (e.g., a CMP process) or exposed as a result of the molding process. Throughout the description, the features over the release film 22, which include redistribution structure 48, the first semiconductor device 52, the underfill 70, and the encapsulant 72 are collectively referred to as a reconstructed wafer.

Next, the reconstructed wafer is de-bonded from carrier 20. In accordance with some embodiments, a UV light is scanned through carrier 20 to project on release film 22. The release film 22 absorbs the energy of the UV light and is decomposed. Carrier 20 may thus be lifted off from the release film 22, and hence reconstructed wafer is de-bonded (demounted) from carrier 20.

FIG. 12 further illustrates UBMs 76 formed along a bottom side of the redistribution structure 48. The formation process of UBMs 76 may include forming openings in the dielectric layer 24, forming a metal seed layer (not shown) in the openings and on the dielectric layer 24, forming a patterned mask (not shown) such as a photoresist over the metal seed layer, and then performing a metal plating process on the exposed seed layer. The patterned mask and the portions of the metal seed layer covered by the patterned mask are then removed, leaving the UBMs 76. In some embodiments, the metal seed layer includes a titanium layer and a copper layer over the titanium layer. The metal seed layer may be formed using, for example, PVD. The plating may be performed using, for example, electrochemical plating.

Solder regions 78 are then formed on the UBMs 76. In accordance with some embodiments, the formation of solder regions 78 may include placing solder on the UBMs 76, and then reflowing the solder to form solder balls. In some embodiments, the formation process of solder regions 78 may include plating or screen printing solder regions on the UBMs 76, and then reflowing the plated solder regions. A singulation process may then be performed to saw the reconstructed wafer as a plurality of packages 100, which are identical to each other.

In some embodiments, the package 100 is bonded to another package component, which is or comprises a package substrate, an interposer, a package, or the like. Other features and processes may also be included. For example, testing structures may be included to aid in the verification testing of the packaged structures. The testing structures may include, for example, test pads formed in a redistribution layer or on a substrate that allows the testing of the semiconductor devices, the use of probes and/or probe cards, and the like. The verification testing may be performed on intermediate structures as well as the final structure. Additionally, the structures and methods disclosed herein may be used in conjunction with testing methodologies that incorporate intermediate verification of known good semiconductor devices to increase the yield and decrease costs.

Figure 13A:
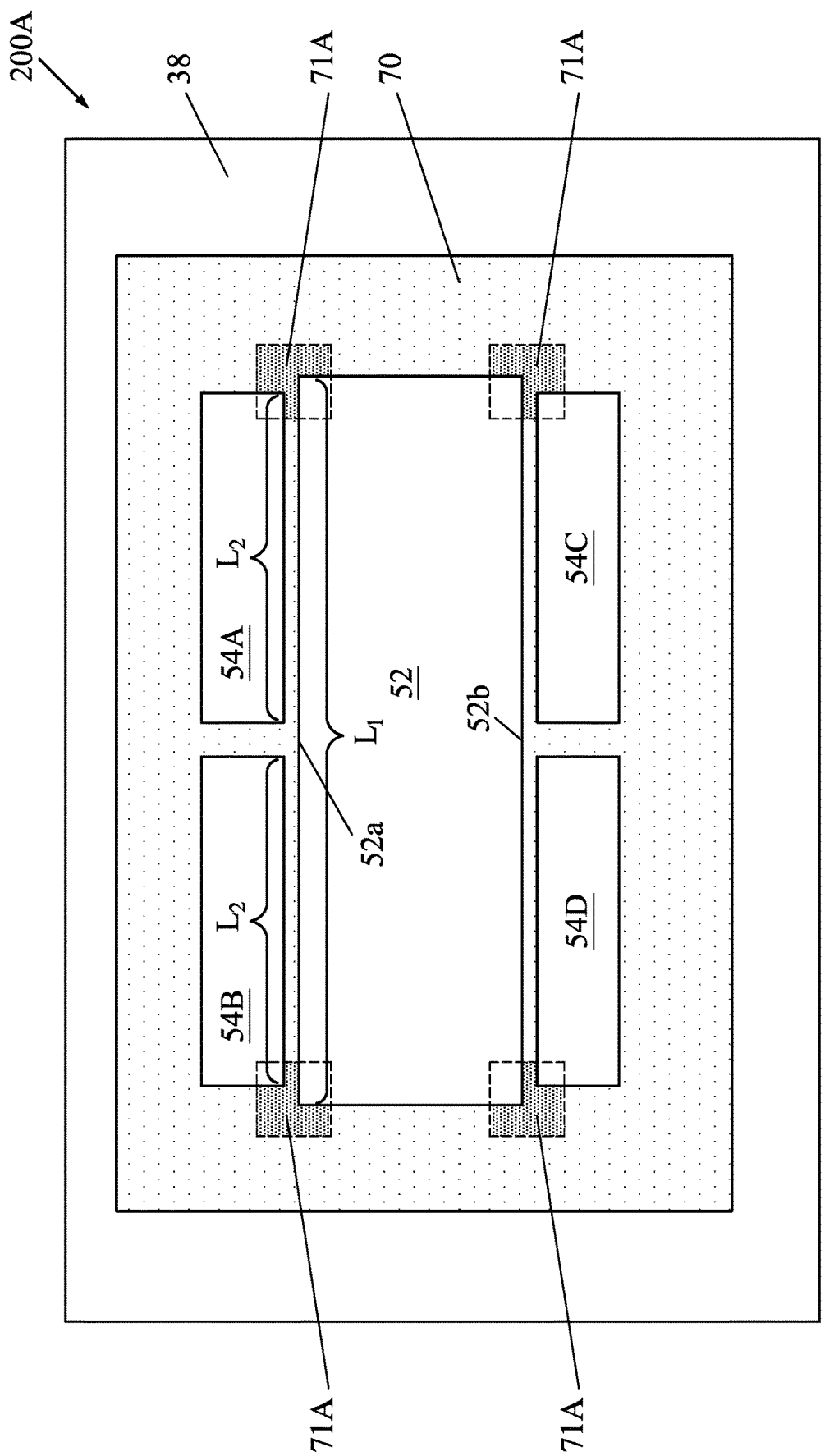
Figure 13B:
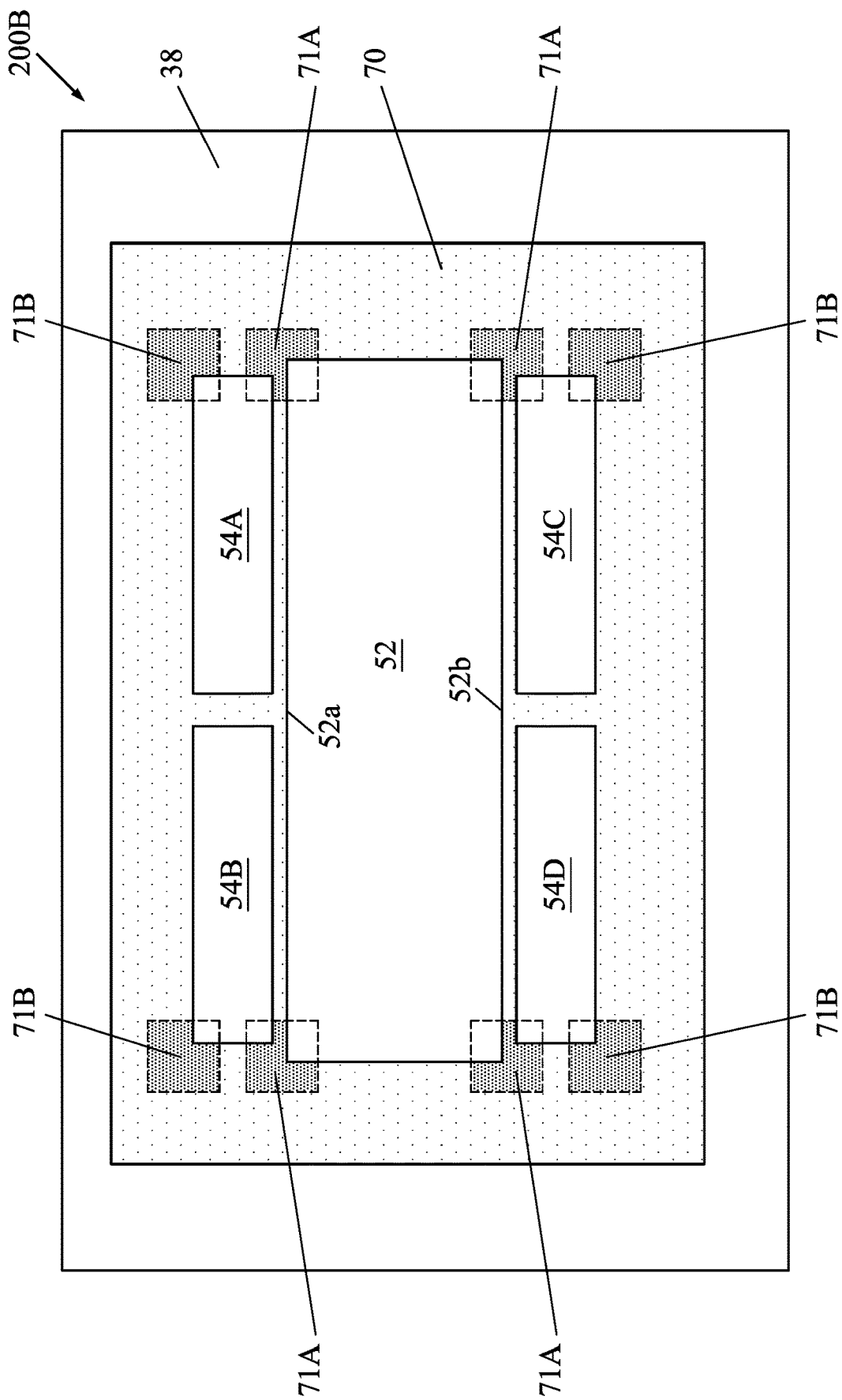
Figure 13C:
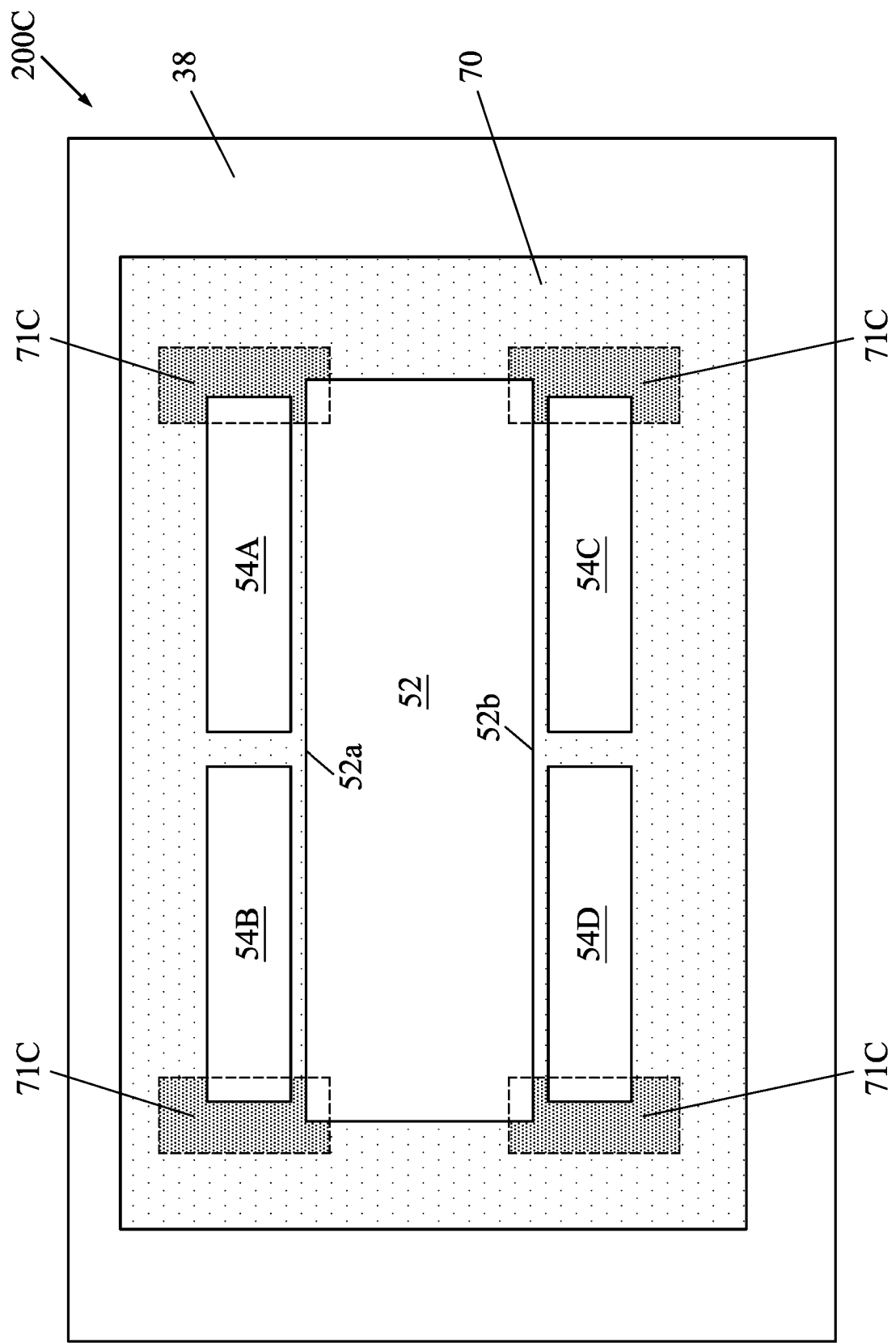
Figure 14A:
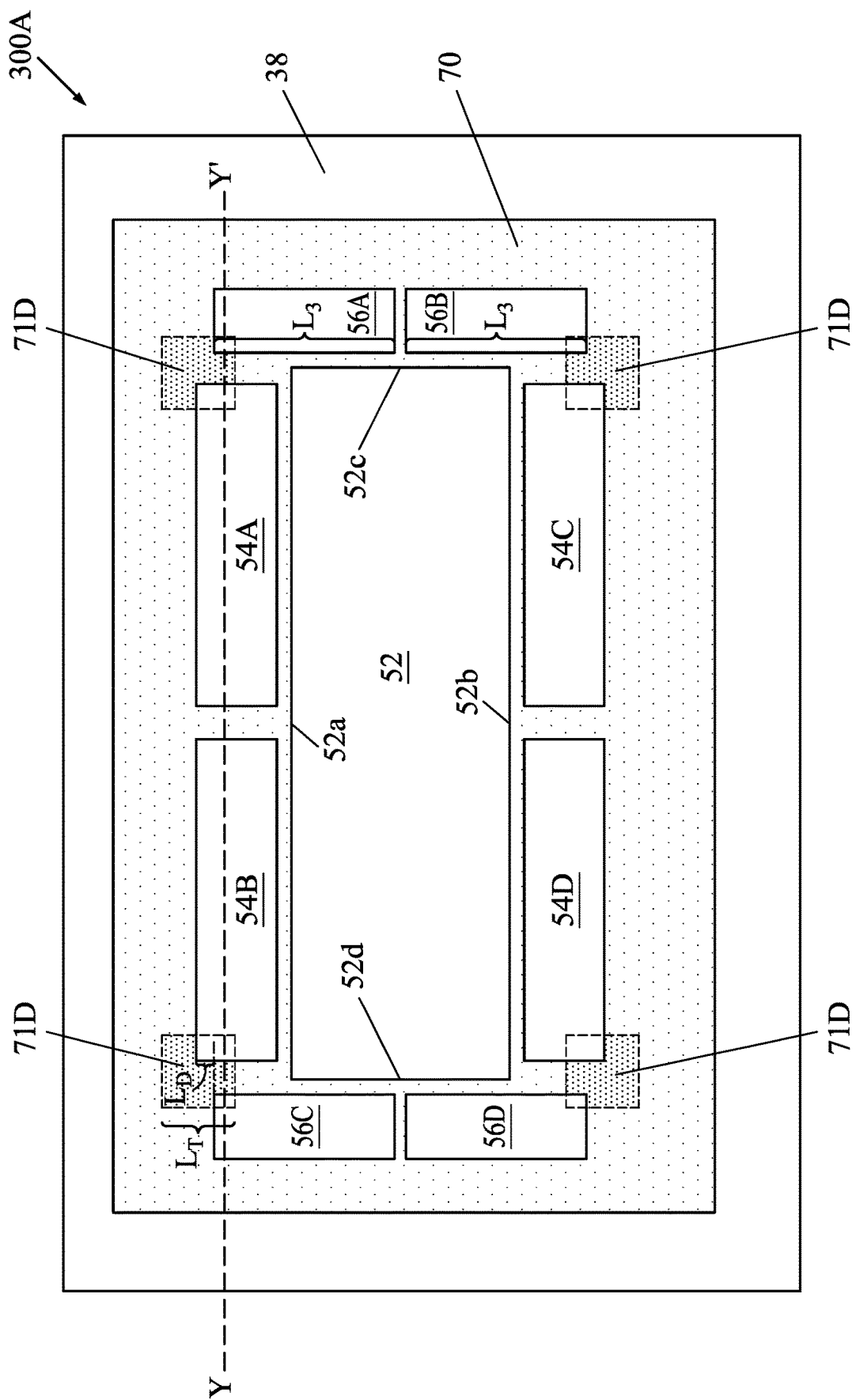

FIGS. 13A-13C illustrate plan views of packages 200A-200C, respectively, in accordance with some embodiments. The encapsulant is not illustrated in FIGS. 13A-13C for illustrative purposes, and in some embodiments an encapsulant may be placed over the structures illustrated in FIGS. 13A-13C. As illustrated in FIGS. 13A-13C, the packages 200A-200C each comprises a semiconductor device arrangement disposed on the redistribution structure 48, which includes the first semiconductor device 52, a second semiconductor device 54A and a third semiconductor device 54B disposed on a first side 52a of the first semiconductor device 52, and a fourth semiconductor device 54C and a fifth semiconductor device 54D disposed on a second side 52b of the first semiconductor device 52 opposite to the first side 52a of the first semiconductor device 52 in accordance with some embodiments. The first to fifth semiconductor devices 52, 54A-54D may be laterally surrounded by the underfill 70 in a plan view as illustrated in FIG. 13A. As will be discussed in greater detail below, the underfill 70 may include protrusions 71A-71C located in high-stress areas in the packages 200A-200C to reduce the stress generated by the CTE mismatch between the underfill 70 and the semiconductor devices 52, 54A-54D.

The second to fifth semiconductor devices 54A-54D may have a plan-view quadrilateral shape, such as a rectangular shape. The second to fifth semiconductor devices 54A-54D may include any type of semiconductor devices, such as logic devices, memory devices, input-output (IO) devices, device stacks thereof, or the like in any combination. The memory devices may include, such as dynamic random-access memory (DRAM) devices, static random-access memory (SRAM) devices, hybrid memory cube (HMC) modules, high bandwidth memory (HBM) modules, or the like. In some embodiments, the second to fifth semiconductor devices 54A-54D are the same type semiconductor devices, such as the memory devices, and the first semiconductor device 52 is a logic device. In some embodiments, the first semiconductor device 52 is formed in a same processes of a same technology node, or may be formed in processes of technology nodes as one or more of the second to fifth semiconductor devices 54A-54D. The second to fifth semiconductor devices 54A-54D may be made of a same technology node or different technology nodes. For example, the first semiconductor device 52 is made of a more advanced process node than the second to fifth semiconductor devices 54A-54D in accordance with some embodiments. In some embodiments, the first semiconductor device 52 has more transistors and a greater size (e.g., occupies more areas and/or greater height) than each of the second to fifth semiconductor devices 54A-54D. For example, the first semiconductor device 52 has a length L1, and each of the second to fifth semiconductor devices 54A-54D has a length L2. The length L1 of the first semiconductor device 52 is at least twice greater than the length L2 of the second to fifth semiconductor devices 54A-54D in accordance with some embodiments.

FIG. 13A illustrates a plan view of the package 200A in accordance with some embodiments. The package 200A may include similar features as the package 100, wherein like reference numerals refer to like elements. FIG. 13A illustrates an embodiment including a semiconductor device arrangement, which may include the second semiconductor device 54A and the third semiconductor device 54B disposed on the first side 52a of the first semiconductor device 52, and the fourth semiconductor device 54C and the fifth semiconductor device 54D disposed on a second side 52b of the first semiconductor device 52 opposite to the first side 52a. In the package 200A, each of the protrusions 71A of the underfill 70 is positioned to overlap a corner of the first semiconductor device 52 and an adjacent corner of one of the second to fifth semiconductor devices 54A-54D in the plan view, including overlapping the respective sidewalls of these corners, which are areas may exhibit high-stress due to excessive accumulation of the underfill 70. Excessive accumulation of the underfill 70 may be prone to occur in these areas because the uncured underfill 70 is dispensed from the outer edges of the semiconductor device arrangement and flow into the gaps between semiconductor devices by capillary action, and these areas are the entrances of the gaps. In some embodiments, the overlapping area between one of the protrusions 71A of the underfill 70 and one of the second to fifth semiconductor devices 54A-54D is about ⅛ or less of the respective overall area of the second to fifth semiconductor device 54A-54D.

In some embodiments, a portion of the underfill 70 directly located on the protrusions 71A has a reduced height on the redistribution structure 48 and relative to the semiconductor devices 52, 54A-54D as compared to portions of the underfill 70 not on the protrusions 71A (e.g., offset from the protrusions 71A in the plan view). Accordingly, the contact area between the underfill 70 and the first to fifth semiconductor devices 52, 54A-54D in the high-stress areas may be reduced, and the risks of generating high stress that could damage the first to fifth semiconductor devices 52, 54A-54D may be reduced or prevented. The reliability of the package 200A may be improved.

FIG. 13B illustrates a plan view of the package 200B in accordance with some embodiments. The package 200B may include similar features as the package 100 and further include protrusions 71B of the underfill 70 extending into the redistribution structure 48. The protrusions 71B of the underfill 70 may overlap outer corners of the second to fifth semiconductor devices 54A-54D and portions of the sidewalls forming those outer corners in a plan view, which are areas that may exhibit high stress in the package 200B. As illustrated in FIG. 13B, the protrusions 71A may be separated from protrusions 71B under each of the second to fifth semiconductor devices 54A-54D. A portion of the underfill 70 directly located on the protrusions 71A, 71B may have reduced heights on the redistribution structure 48 and relative to the semiconductor devices 52, 54A-54D. The contact area between the underfill 70 and the first to fifth semiconductor devices 52, 54A-54D in the high-stress areas may be reduced, and the risks of generating high stress that could damage the first to fifth semiconductor devices 52, 54A-54D may be reduced or prevented. The reliability of the package 200B may be improved.

FIG. 13C illustrates a plan view of the package 200C in accordance with some embodiments. The package 200C may be similar to the package 200B of FIG. 13B, where the protrusions 71A and 71B of package 200B are joined to form a large continuous protrusion, e.g., protrusion 71C, of the underfill 70. Each of the protrusions 71C extends along a respective sidewall of the second to the fifth semiconductor device 54A-54D and may further overlap respective corners of the first semiconductor device 52 in the plan view. As such, the contact area between the underfill 70 and the first to fifth semiconductor devices 52, 54A-54D may be reduced in the high stress areas, and the reliability of the package 200C may be improved.

FIGS. 14A-14E illustrate plan views of packages 300A-300E in accordance with some embodiments. The encapsulant is not illustrated in FIGS. 14A-14E for illustrative purposes, and in some embodiments an encapsulant may be placed over the structures illustrated in FIGS. 14A-14E. The example embodiments shown in FIGS. 14A-14E illustrate another arrangement of semiconductor devices and various example placements of underfill protrusions that may be used to reduce stress in high stress areas. As illustrated in FIGS. 14A-14E, the packages 300A-300E each comprise the first semiconductor device 52 and the second to fifth semiconductor devices 54A-54D arranged as discussed above with reference to FIGS. 13A-13C, further including sixth to ninth semiconductor devices 56A-56D. The sixth and seventh semiconductor devices 56A, 56B are disposed on a third side 52c of the first semiconductor device 52 substantially perpendicular to the first side 52a of the first semiconductor device 52, and the eighth and ninth semiconductor devices 56C, 56D are disposed on a fourth side 52d of the first semiconductor device 52 opposite to the third side 52c of the first semiconductor device 52. The first to ninth semiconductor devices 52, 54A-54D, 56A-56D may be laterally surrounded by the underfill 70 in the plan view, and their sidewalls are partially covered by the underfill 70. As will be discussed in greater detail below, the underfill 70 may include protrusions 71D-71H located at high-stress areas in the packages 300A-300E to reduce the stress generated by the CTE mismatch between the underfill 70 and the semiconductor devices 52, 54A-54D, 56A-56D.

The sixth to ninth semiconductor devices 56A-56D may include logic devices, memory devices, input-output (IO) devices, device stacks thereof, or the like in any combination. In some embodiments, the sixth to ninth semiconductor devices 56A-56D are same type semiconductor devices as the second to fifth semiconductor devices 54A-54D and may be formed in a same process of a same or different technology nodes. The first semiconductor device 52 may have more transistors and may have a greater size (e.g., occupies more areas) than each of the sixth to ninth semiconductor devices 56A-56D. For example, referring to FIG. 14A, the first semiconductor device 52 may have a width $W_1$, and each of the sixth to ninth semiconductor devices 56A-56D has a length $L_3$. In some embodiments, the width $W_1$ of the first semiconductor device 52 is greater than the length $L_3$, though it may be less than twice the length $L_3$.

Referring to FIG. 14A, the underfill 70 may include protrusions 71D extending into the redistribution structure 48. Each of the protrusions 71D of the underfill 70 may be located in the high-stress areas for the second to ninth semiconductor devices 54A-54D, 56A-56D, such as areas at or around the outer corners of the second to fifth semiconductor devices 54A-54D, which are the areas may exhibit high stress due to excessive accumulation of underfill 70 in the package 300A. In some embodiments, each of the protrusions 71D of the underfill 70 overlaps one or more corners of one of the second to fifth semiconductor devices 54A-54D and one or more adjacent corners of one of the sixth to ninth semiconductor devices 56A-56D in the plan view. For example, the protrusion 71D of the underfill 70 at the right upper corner of FIG. 14A overlaps an outer corner of the second semiconductor device 54A (e.g., a corner facing away from the first semiconductor device 52) and an adjacent corner of the sixth semiconductor device 56A. Protrusions 71D of the underfill 70 overlapping respective corners of the third semiconductor device 54B and the eighth semiconductor device 56C, respective corners of the fourth semiconductor device 54C and the seventh semiconductor device 56B, and respective corners of the fifth semiconductor device 54D and the ninth semiconductor device 56D are also shown in FIG. 14A. In some embodiments, each of the protrusions 71D of the underfill 70 has the length $L_T$, and a distance $L_D$ that the second to fifth semiconductor devices 54A-54D extends past corresponding ones of the sixth to ninth semiconductor devices 56A-56D is less than one-third of the length $L_T$ of the protrusions 71D in accordance with some embodiments. In some embodiments, the overlapping area between one of the protrusions 71D of the underfill 70 and one of the second to fifth semiconductor devices 54A-54D is about ⅛ or less of an overall area of the respective one of the second to fifth semiconductor devices 54A-54D. In some embodiments, the overlapping area between one of the protrusions 71D of the underfill 70 and one of the sixth to ninth semiconductor devices 56A-56D is about ⅛ or less of an overall area of the respective one of the sixth to ninth semiconductor devices 56A-56D.

As such, a portion of the underfill 70 directly located on the protrusions 71D may have a reduced height on the redistribution structure 48 and relative to the semiconductor devices 54A-54D, 56A-56D. The contact area between the underfill 70 and the second to ninth semiconductor devices 54A-54D, 56A-56D in the high-stress areas may be reduced. Risks of generating high stress that could damage the second to ninth semiconductor devices 54A-54D, 56A-56D may be further reduced or prevented. The reliability of the package 300A may be improved.

Figure 14B:
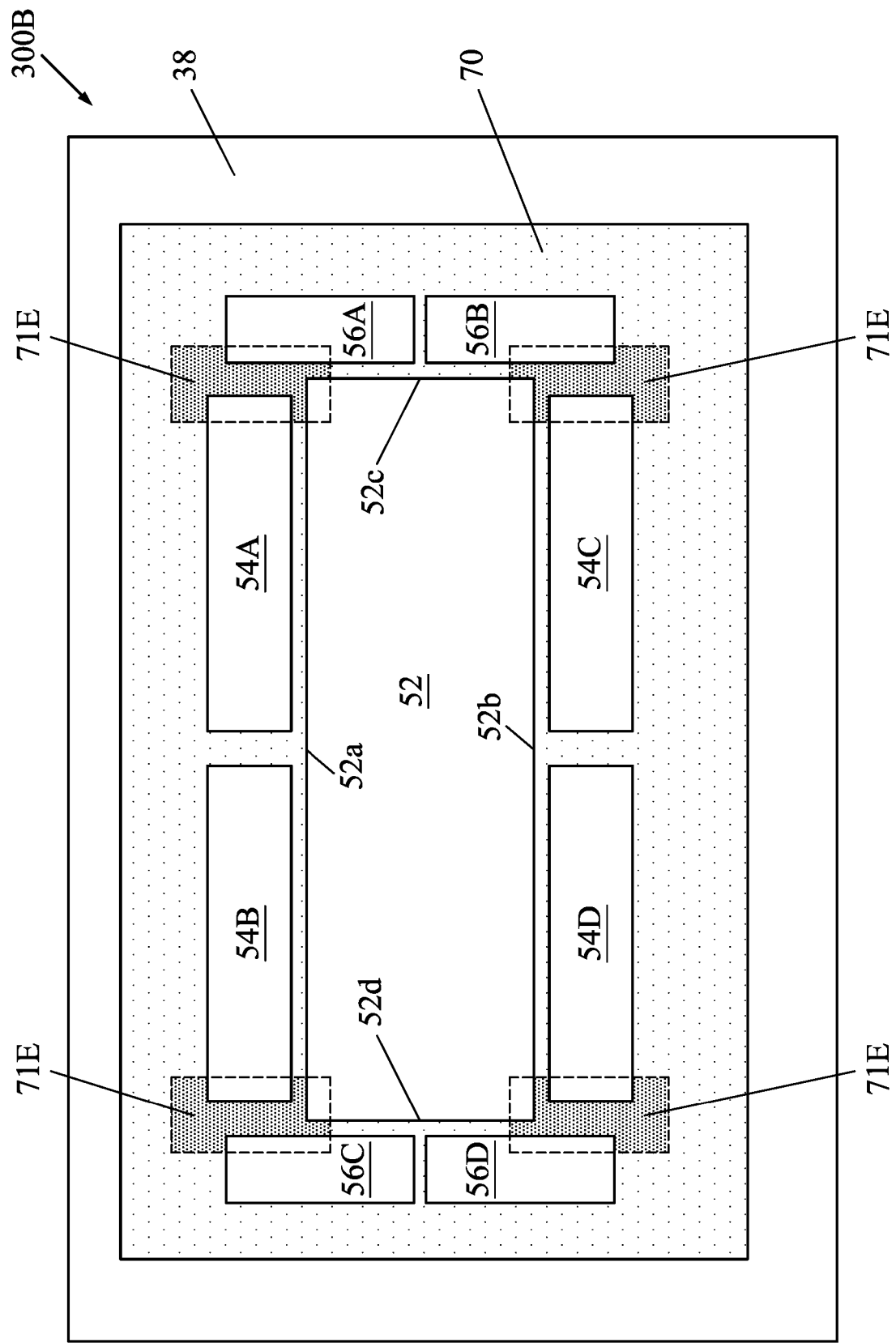
Figure 15:
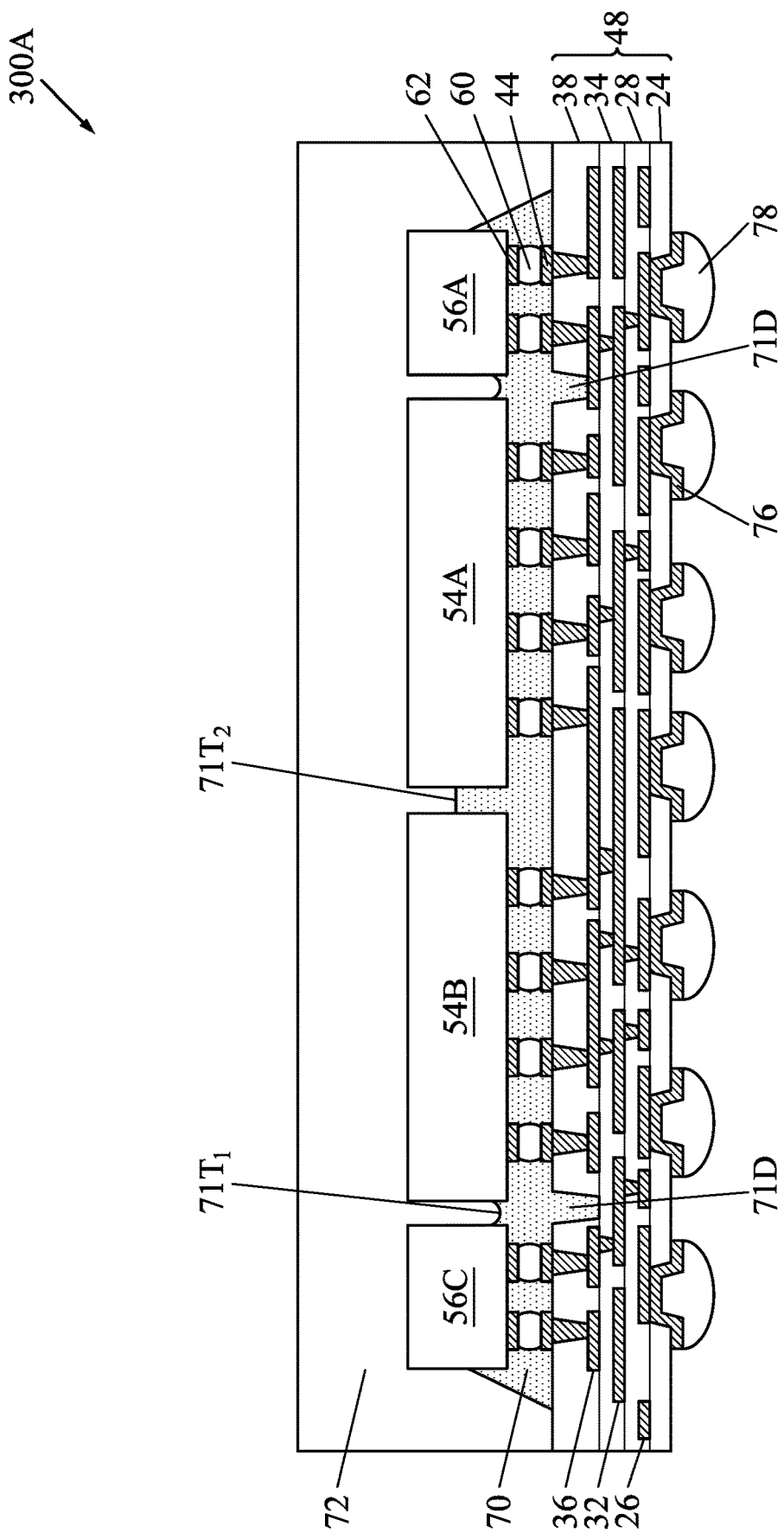

FIG. 14B illustrates a plan view of the package 300B in accordance with some embodiments. The package 300B may be similar to the package 300A and with the protrusions 71D of package 300A being enlarged to form protrusions 71E of package 300B that extend along the sidewalls of the corresponding second to fifth semiconductor devices 54A-54D in their width directions and may extend to overlap adjacent corners of the first semiconductor device 52 in the plan view. Accordingly, a greater portion of the underfill 70 directly located on the protrusions 71E may have reduced heights and may reduce the contact area between the underfill 70 and the first to ninth semiconductor devices 52, 54A-54D, 56A-56D in the high-stress areas of the package 300B. Risks of generating high stress that could damage the first to ninth semiconductor devices 52, 54A-54D, 56A-56D may be reduced or prevented. The reliability of the package 300B may be improved.

Figure 14C:
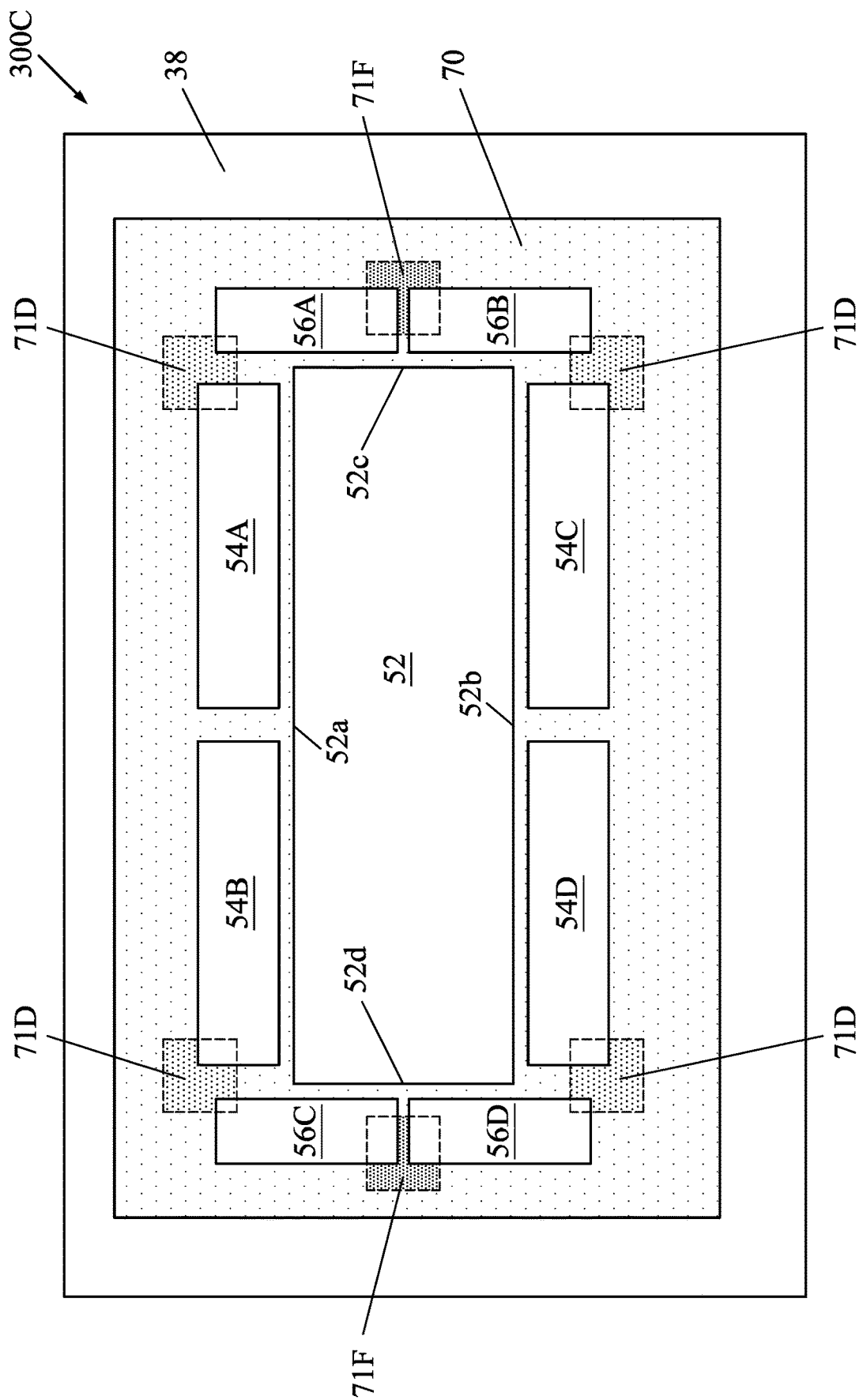
Figure 14D:
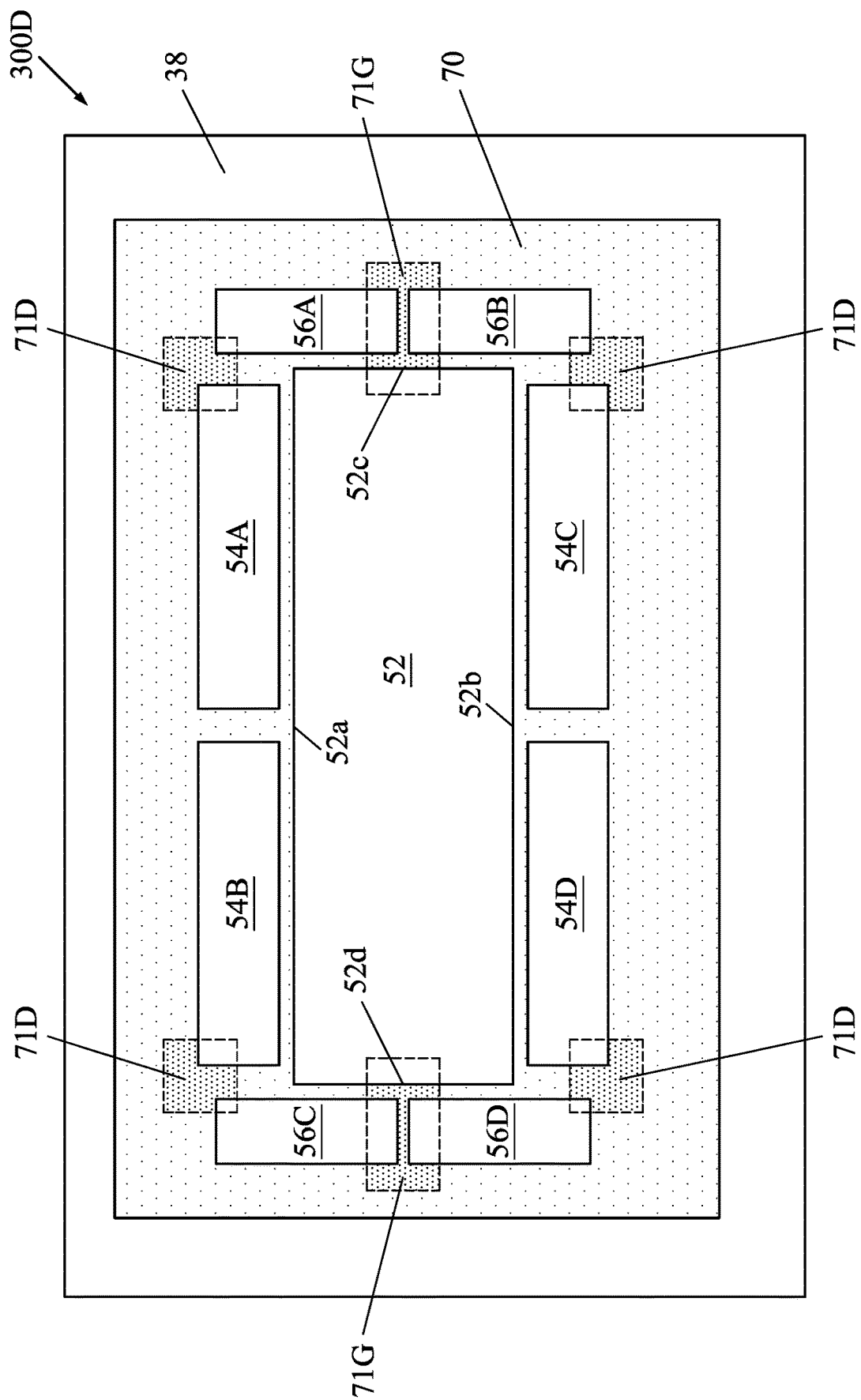

FIGS. 14C and 14D illustrate plan views of the packages 300C and 300D in accordance with some embodiments. The packages 300C and 300D may be similar to the package 300A and further include protrusions 71F of the underfill 70 and protrusions 71G of the underfill 70, respectively. For example, referring to FIG. 14C, one of the protrusions 71F of the underfill 70 is located to overlap adjacent outer corners of the sixth and seventh semiconductor devices 56A, 56B (e.g., corners facing away from the first semiconductor device 52). Another protrusion 71F of the underfill 70 may be located at a similar position for the eighth and ninth semiconductor devices 56C, 56D, as illustrated in FIG. 14C. In some embodiments, as illustrated in FIG. 14D, the protrusions 71G of the underfill 70 are located at positions similar to the protrusions 71F of the underfill 70 as illustrated in FIG. 14C and further extend to overlap adjacent inner corners of the sixth and seventh semiconductor devices 56A, 56B or the eighth and ninth semiconductor devices 56C, 56D. The protrusions 71G of the underfill 70 may extend under sidewalls of the first semiconductor device 52 as illustrated in FIG. 14D. In some embodiments, with the formation of the protrusions 71F or 71G of the underfill 70, risks of generating high stress that could damage the first to ninth semiconductor devices 52, 54A-54D, 56A-56D are reduced or prevented. The reliability of the package 300C and 300D may be improved.

Figure 14E:
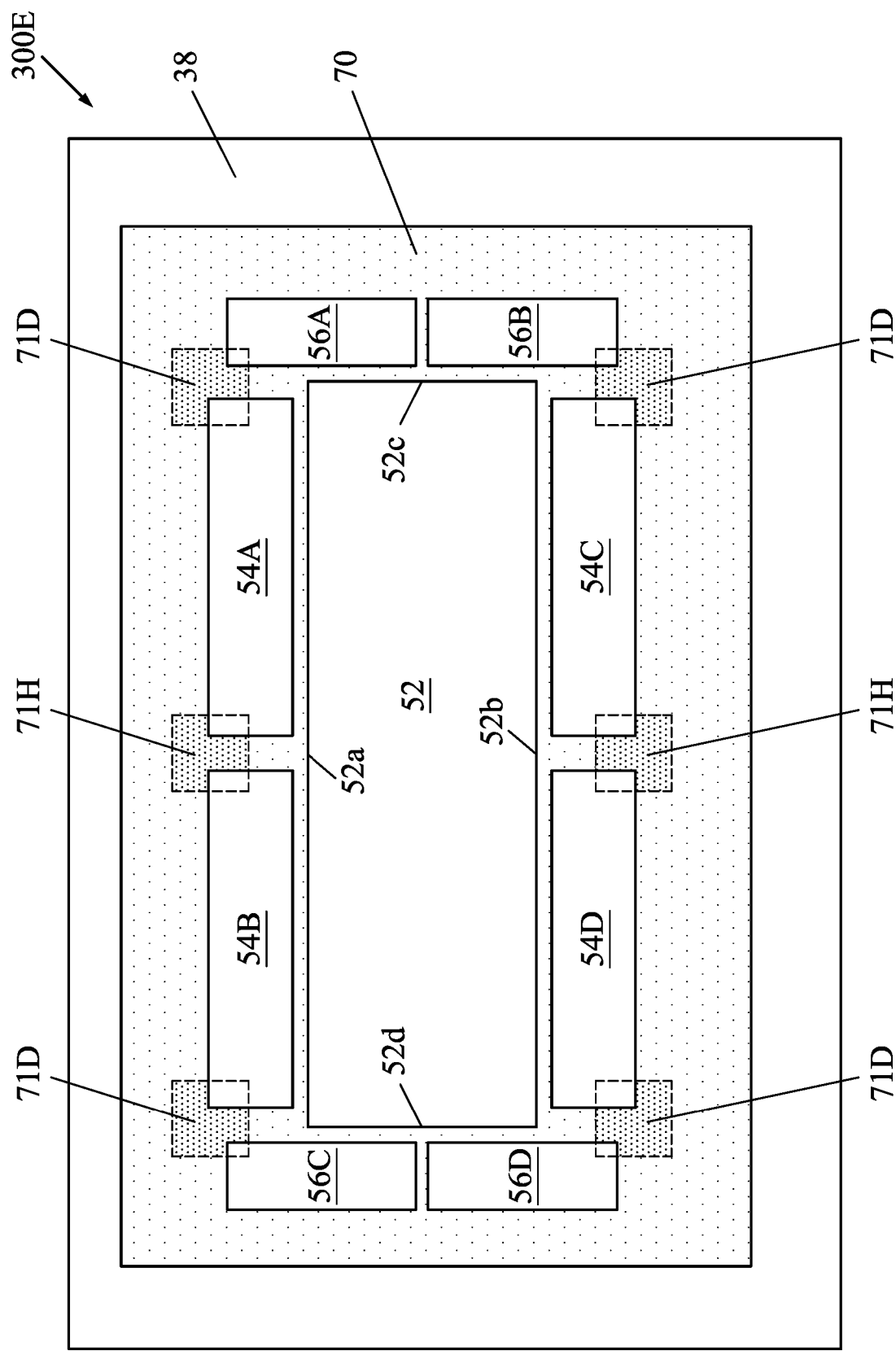

FIG. 14E illustrates a plan view of the package 300E in accordance with some embodiments. The package 300E may include similar features as the package 300A and further include the protrusions 71H of underfill 70 located in high stress areas of the package 300E. As illustrated in FIG. 14E, one of the protrusions 71H may overlap adjacent outer corners of the second and third semiconductor devices 54A, 54B, and the other one of the protrusions 71H may overlap adjacent outer corners of the fourth and fifth semiconductor devices 54C, 54D in the plan view. Risks of generating high stress that could damage the second to ninth semiconductor devices 54A-54D, 56A-56D may be reduced or prevented, and the reliability of package 300E may be improved. Although not shown in FIG. 14E, it is appreciated that the protrusions 71H of the underfill 70 may be extended to overlap the adjacent inner corners of second to fifth semiconductor devices 54A-54D or in some embodiments further extend under sidewalls of the first semiconductor device 52 in the plan view.

FIG. 15 illustrates a cross-sectional view of a package comprising a plurality of semiconductor devices in accordance with some embodiments, using the package 300A as illustrated in FIG. 14A as an example. FIG. 15 illustrates the cross-sectional view according to a section Y-Y' as illustrated in FIG. 14A. As illustrated in FIG. 15, the underfill 70 includes the protrusions 71D extending into the redistribution structure 48. A portion of the underfill 70 directly located on the protrusions 71D may have reduced heights. For example, a top surface $70T_1$ of the underfill 70 between adjacent semiconductor devices (e.g., 54A and 56A) and directly located on the protrusions 71D may be lower than a top surface $70T_2$ of the underfill 70 between the adjacent semiconductor devices (e.g., 54A and 54B) and not directly located on the protrusions 71D (e.g., offset from the protrusions 71D in the plan view).

Figure 16:
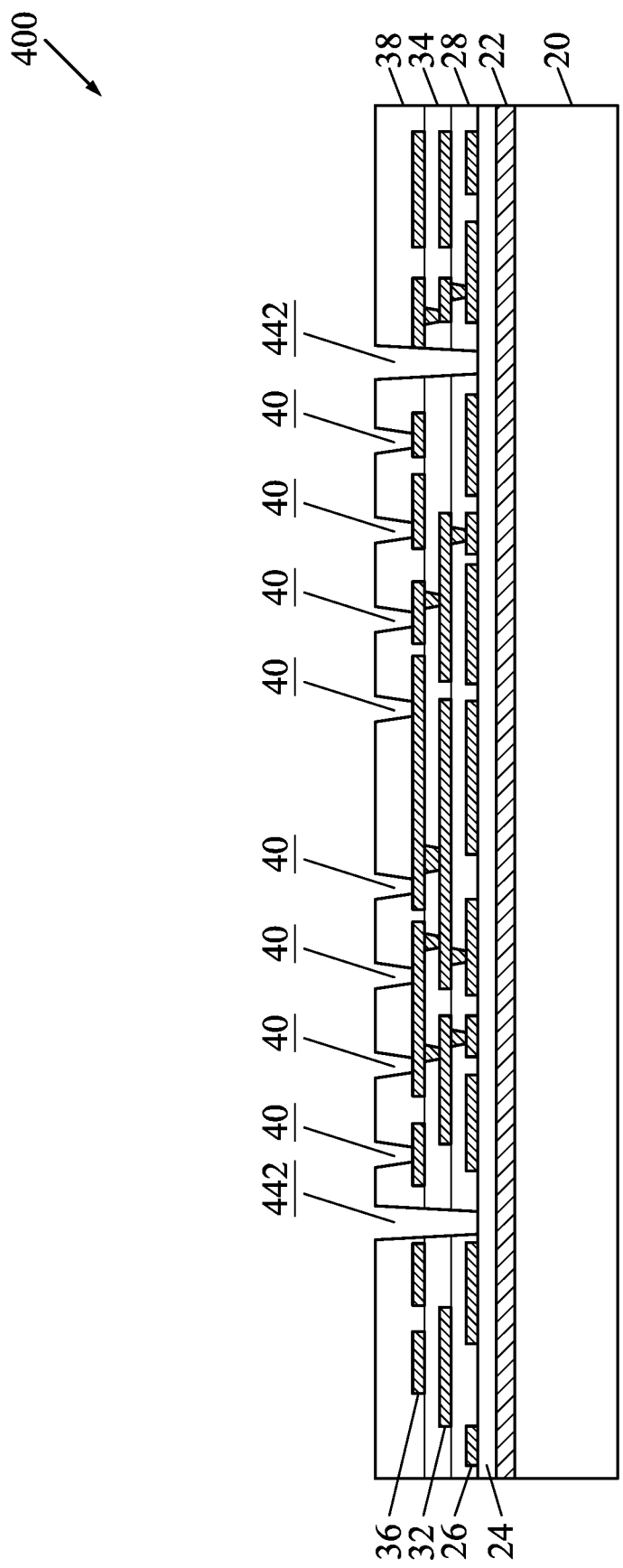
Figure 17:
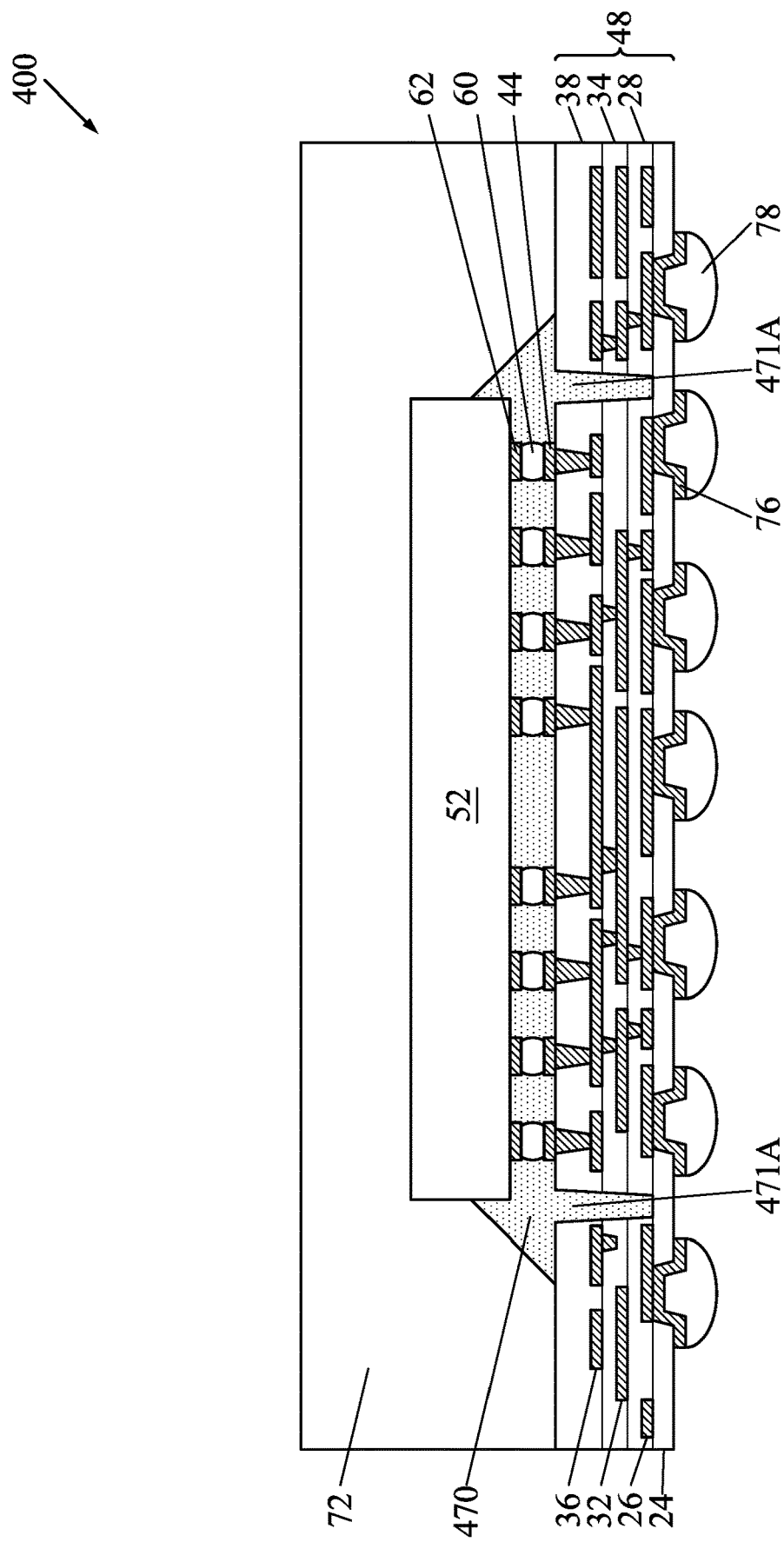

FIGS. 16 and 17 illustrate cross-sectional views of intermediate stages of forming a package 400 in accordance with some embodiments. The package 400 may be formed using similar processing steps for the package 100, with forming trenches 442 penetrating through two or more dielectric layers of the redistribution structure 48. In particular, the processing illustrated in FIGS. 16 and 17 assumes the processing illustrated in FIGS. 1 to 8A performed prior. Accordingly, after the processing discussed above with reference to FIGS. 1 to 8A, processing may proceed to FIG. 16. The trenches 42 of FIG. 8A are extended to form trenches 442 extending through the dielectric layers 34 and 28 by etching the dielectric layers 34 and 28 from the locations of trenches 42 in accordance with some embodiments. For example, a patterned mask (not shown), such as a photoresist and/or a hard mask, may be formed to cover the openings 40 and expose the trenches 42 of FIG. 8A. For example, a mask layer may be deposited and patterned to include patterns of the trenches 442. An etch process is then performed to etch the dielectric layers 34 and 28, thereby forming the trenches 442. The etch process may include a dry etching or a wet etching. The patterned mask may be removed after etching. Although FIG. 16 only illustrates etching the dielectric layers 34 and 28, the etch process may etch the dielectric layer 34 only or more dielectric layers underlying the dielectric layers 28 when there are more dielectric layers formed between the dielectric layer 28 and the dielectric layer 24.

Next, the processing steps illustrated in FIGS. 11A-11C and 12 are performed after the formation of trenches 442 in accordance with some embodiments. The resulting structure of package 400 is illustrated in FIG. 17. The package 400 may have a structure including similar features as the package 100, wherein the trenches 442 have a greater depth than the trenches 42, such as penetrating through more dielectric layers to allow a greater amount of underfill 470 to flow into and fill the trenches 442. As such, protrusions 471A of the underfill 470 may have a greater volume disposed in the redistribution structure 48, and the heights of the underfill 470 directly located on the protrusions 471A of the underfill 470 relative to the first semiconductor device 52 are further reduced. The stress between the underfill 470 and the first semiconductor device 52 resulting from the CTE mismatch between the underfill 470 and the first semiconductor device 52 may be reduced, and the reliability of package 400 may be improved. It is appreciated that although one semiconductor device 52 is illustrated in FIGS. 16 and 17, the trenches 442 and the protrusions 471A of the underfill 470 may also be used in a package comprising a plurality of semiconductor devices. For example, the trenches 442 and the protrusions 471A may be used with any of the above configurations to, for example, replace the trenches 42 and protrusions 71A-71H with the trenches 442 and the protrusions 471A in accordance with some embodiments.

Figure 18:
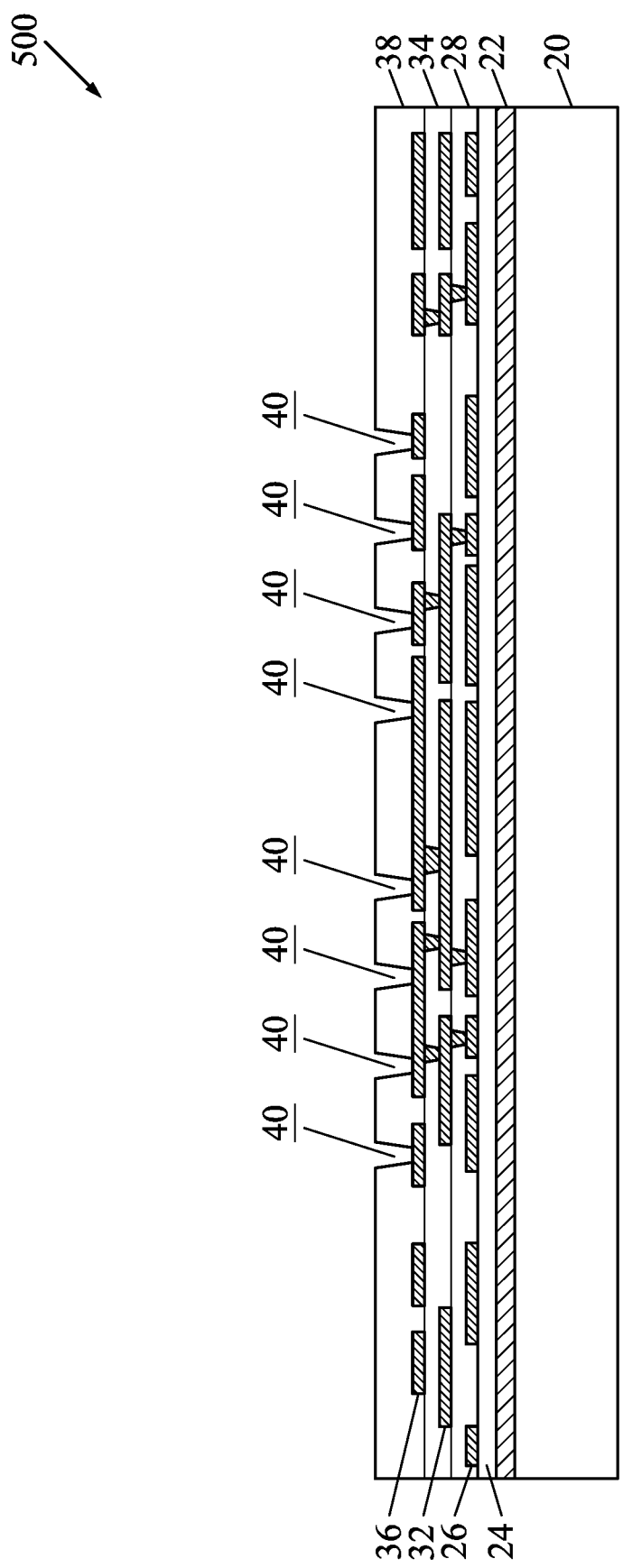
Figure 19:
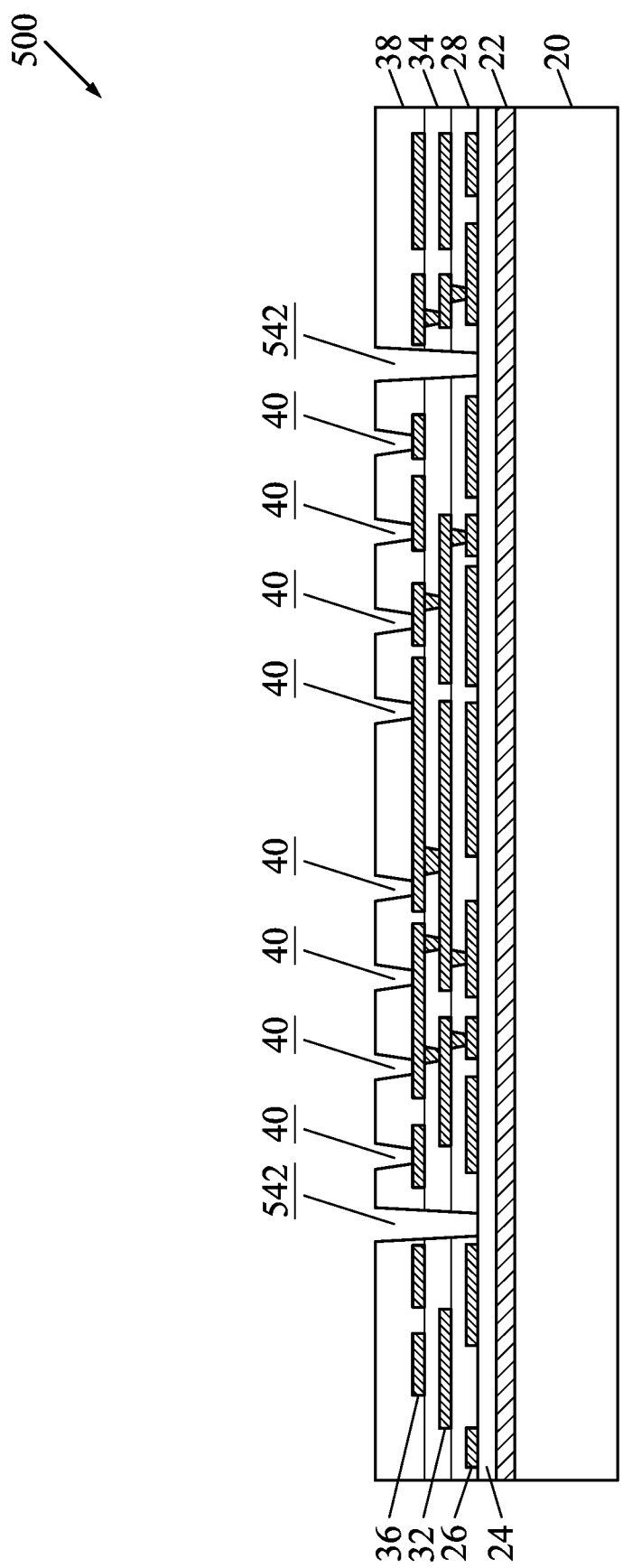
Figure 20:
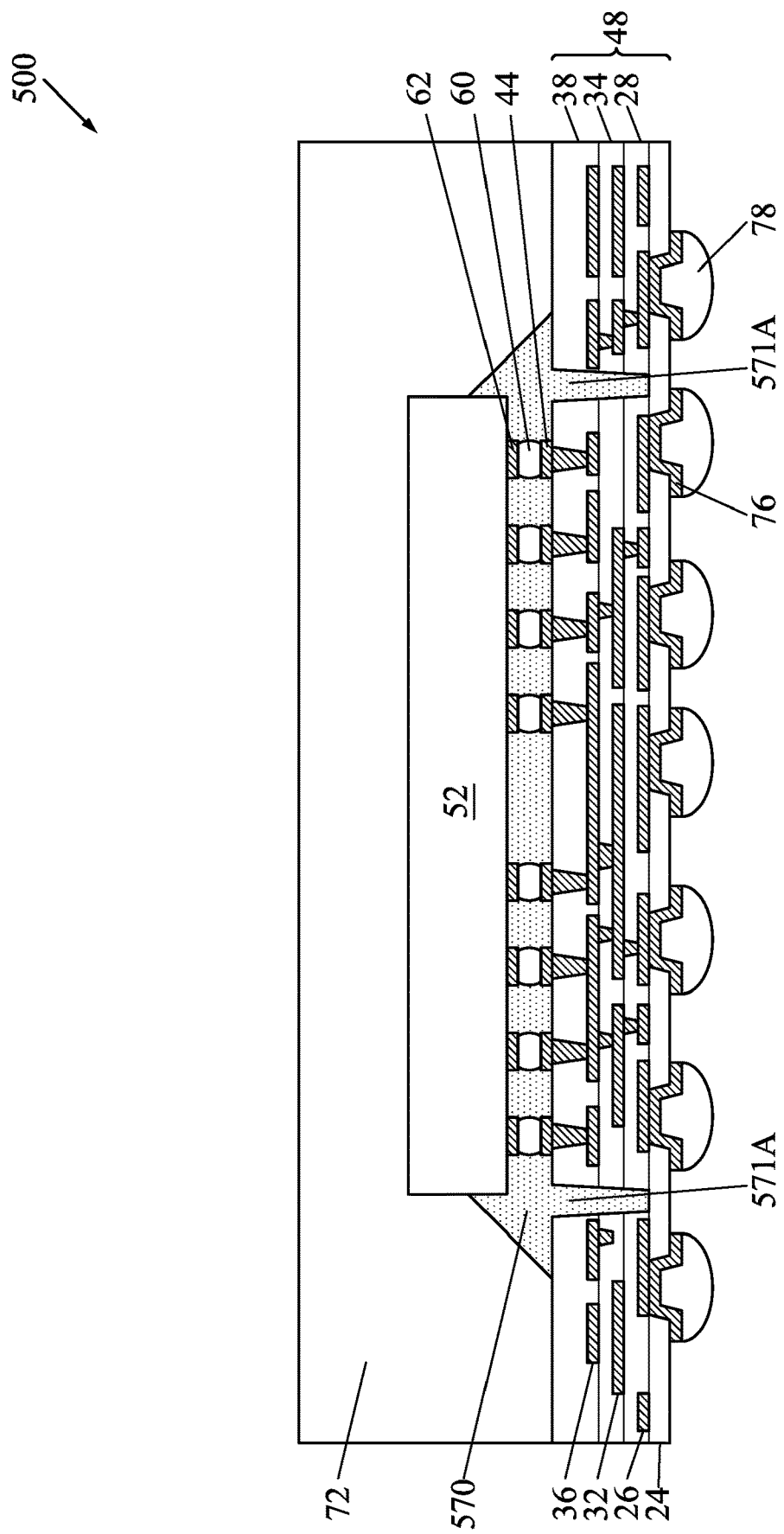

FIGS. 18-20 illustrate cross-sectional views of intermediate stages of forming the package 500 in accordance with some embodiments, where the trenches 542 (see FIG. 19) are formed without previously forming the trenches 42. The processing illustrated in FIGS. 18-20 assumes the processing illustrated in FIGS. 1 to 7 performed prior. After the dielectric layer 38 is formed, as illustrated in FIG. 7, processing may proceed to FIG. 18, wherein openings 40 are formed in the dielectric layer 38. The openings 40 may be formed by a light-exposure and developing process, and the dielectric layer 38 of a photosensitive material is cured after the formation of the openings 40.

Next, referring to FIG. 19, the trenches 542 are formed in accordance with some embodiments. The formation of the trenches 542 may include forming a patterned mask (not shown) that includes the pattern of the trenches 542 and etching the dielectric layers 38, 24, 28 according to the pattern of the patterned mask, thereby forming the trenches 542 formed in the dielectric layers 38, 34 and 28. The patterned mask may cover the openings 40 while forming the trenches 542. The patterned mask may be removed after the formation of the trenches 542. Although FIG. 19 illustrates etching the dielectric layers 38, 34, and 28, the etch process may etch the dielectric layers 38 and 34 only or etch more dielectric layers underlying the dielectric layers 28 when there are more dielectric layers formed between the dielectric layer 28 and the dielectric layer 24.

Next, the processing steps illustrated in FIGS. 11A-11C and 12 are performed to form the underfill 570 and the encapsulant 72 after the trenches 542 are formed, and a resulting structure of the package 500 as illustrated in FIG. 20 is obtained. The package 500 may include similar features as the package 100 and with the trenches 542 that have a greater depth than the trenches 42, such as penetrating through more dielectric layers to allow a greater amount of underfill 570 to flow into and fill the trenches 542. As such, protrusions 571A of the underfill 570 may have a greater volume, and the heights of the underfill 570 directly located on the protrusions of the underfill 570 relative to the first semiconductor device 52 are further reduced. The stress between the underfill 570 and the first semiconductor device 52 resulting from the CTE mismatch between the underfill 570 and the first semiconductor device 52 may be reduced, and the reliability of package 500 may be improved. It is appreciated that although one semiconductor device 52 is illustrated in FIGS. 18-20, the trenches 542 and the protrusions 571A of the underfill 570 may also be used in a package comprising a plurality of semiconductor devices. For example, the trenches 442 and the protrusions 471A may be used with any of the above configurations to, for example, replace the trenches 42 and protrusions 71A-71H with the trenches 542 and the protrusions 571 in accordance with some embodiments.

Figure 21:
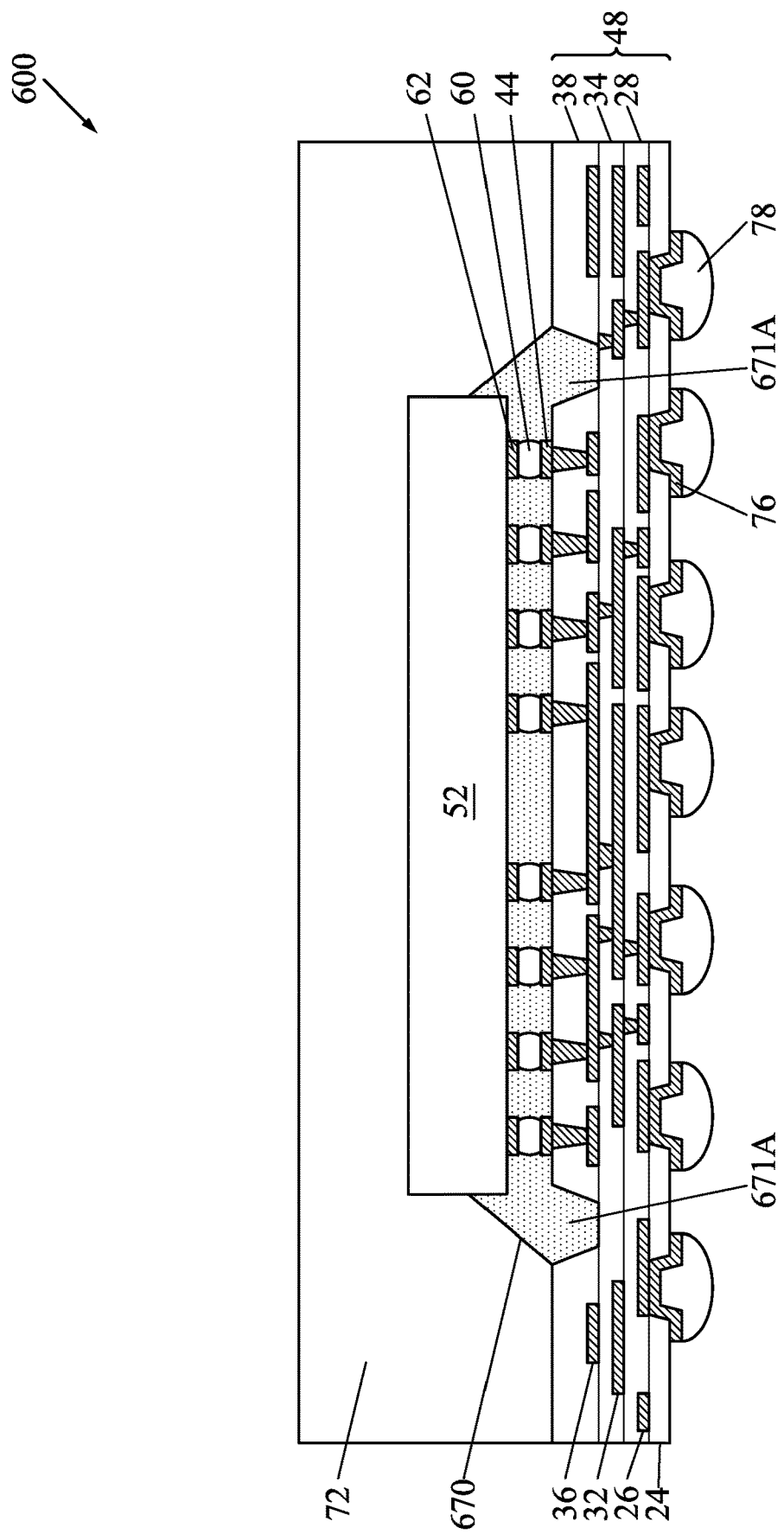

FIG. 21 illustrates a cross-sectional view of a package 600 in accordance with some embodiments. The package 600 is similar to the package 100 (see FIG. 11A), and with a underfill 670 including wide protrusions 671A, wherein the like reference numerals refer to like features. In some embodiments, the protrusions 671A of the underfill 670 may have a width 2 to 5 times than the width of protrusions 71A of the package 100. As such, the underfill 670 may not extend over the outer boundary of protrusions 671A. Although FIG. 21 shows the protrusions 671A of the underfill 670 merely exists in the dielectric layer 38, it is appreciated that the protrusions 671A of the underfill 670 may extend to the dielectric layer 34 or the dielectric layer 28.

A package including an underfill and the method of forming the same are provided in accordance with some embodiments. In accordance with some embodiments of the present disclosure, the underfill is disposed on a redistribution structure and surrounds one or more semiconductor devices. The redistribution structure may have trenches so that the underfill may flow into the trenches to form protrusions in the redistribution structure, which leads to reduced heights of the underfill relative to the semiconductor device and reduced contact area between the underfill and the semiconductor device. With forming the trenches and protrusions of underfill filling them at high stress areas where high stress may be generated by the CTE mismatch of the underfill and the semiconductor device, the reliability of the package may be improved. Also, the heights of the underfill and the contact area between the underfill and the semiconductor device may be adjusted by adjusting the positions and depths of the trenches and the protrusions of the underfill.

In an embodiment, a package including a redistribution structure including a first dielectric layer and a first conductive element disposed in the first dielectric layer; a first semiconductor device bonded to the redistribution structure, wherein the first semiconductor device includes a first corner; and an underfill disposed over the redistribution structure and including a first protrusion extending into the first dielectric layer of the redistribution structure, wherein the first protrusion of the underfill overlaps the first corner of the first semiconductor device in a plan view. In an embodiment, the redistribution structure further includes a second dielectric layer underlying the first dielectric layer; and a second conductive element disposed in the first dielectric layer and the second dielectric layer, wherein the second conductive element is in contact with the first protrusion of the underfill. In an embodiment, the redistribution structure further includes a second dielectric layer underlying the first dielectric layer, wherein the first protrusion of the underfill extends into the second dielectric layer. In an embodiment, an overlapping area of the first protrusion of the underfill and the first semiconductor device is less than ⅛ of an area of the first semiconductor device in the plan view. In an embodiment, the package includes a second semiconductor device adjacent to the first semiconductor device, wherein the first protrusion of the underfill overlaps a corner of the second semiconductor device in the plan view. In an embodiment, the underfill further includes a second protrusion overlapping a second corner of the first semiconductor device in the plan view. In an embodiment, the package further includes a second semiconductor device and a third semiconductor device disposed adjacent to the first semiconductor device, wherein the underfill further includes a second protrusion extending into the redistribution structure and overlapping a corner of the second semiconductor device and a corner of the third semiconductor device in the plan view. In an embodiment, a top surface of a first portion of the underfill directly located on the first protrusion of the underfill is lower than a top surface of a second portion of the underfill that is offset from the first protrusion of the underfill in the plan view.

In an embodiment, a package including a first semiconductor device bonded to a redistribution structure; a second semiconductor device bonded to the redistribution structure, the second semiconductor device being on a first side of the first semiconductor device in a plan view; a third semiconductor device bonded to the redistribution structure, the third semiconductor device being on the first side of the first semiconductor device; and an underfill disposed on the redistribution structure and including a first protrusion extending into the redistribution structure, wherein the first protrusion of the underfill overlaps a corner of the second semiconductor device in the plan view, wherein the corner of the second semiconductor device faces away from the first semiconductor device and the third semiconductor device. In an embodiment, the first protrusion of the underfill further extends to overlap the first semiconductor device in the plan view. In an embodiment, the package further includes a fourth semiconductor device bonded to the redistribution structure and disposed on a second side of the first semiconductor device, the second side of the first semiconductor device being adjacent to the first side of the first semiconductor device, wherein the first protrusion of the underfill overlaps a corner of the fourth semiconductor device in the plan view. In an embodiment, the corner of the fourth semiconductor device is disposed between a first line including a first sidewall and a second line include a second sidewall opposite the first sidewall of the second semiconductor device. In an embodiment, the package further includes a fifth semiconductor device bonded to the redistribution structure, wherein the fifth semiconductor device is on a same side of the first semiconductor device as the fourth semiconductor device, wherein the underfill further includes a second protrusion extending into the redistribution structure, wherein the second protrusion of the underfill overlaps adjacent outer corners of the four semiconductor device and the fifth semiconductor device in the plan view, wherein the adjacent outer corners face away from the first semiconductor device. In an embodiment, the second protrusion of the underfill overlaps a sidewall of the first semiconductor device in the plan view. In an embodiment, the underfill further includes a second protrusion extending into the redistribution structure, wherein the second protrusion of the underfill overlaps the second semiconductor device and the third semiconductor device in the plan view.

In an embodiment, a method of forming a package, the method including forming a redistribution structure on a carrier, wherein the redistribution structure includes a first dielectric layer and a conductive element, the first dielectric layer having a first trench; bonding a first semiconductor device to the redistribution structure, wherein a corner of the first semiconductor device overlaps the first trench of the redistribution structure in a plan view; and forming an underfill on the redistribution structure, wherein the underfill is in contact with sidewalls of the first semiconductor device and fills the first trench of the first dielectric layer. In an embodiment, forming the redistribution structure includes forming the first dielectric layer on the carrier; patterning the first dielectric layer to form an opening and the first trench in the first dielectric layer; forming a mask layer covering the first trench and exposing the opening; forming the conductive element in the opening; and removing the mask layer. In an embodiment, forming the redistribution structure further includes forming a second dielectric layer on the carrier before forming the first dielectric layer; and etching the second dielectric layer from the first trench in the first dielectric layer after removing the mask layer. In an embodiment, forming the redistribution structure includes forming a second dielectric layer on the carrier; forming the first dielectric layer on the second dielectric layer; patterning the first dielectric layer to form an opening in the first dielectric layer; forming the conductive element in the opening; forming a mask layer covering the conductive element; and etching the first dielectric layer and the second dielectric layer to form the first trench; and removing the mask layer. In an embodiment, the method further includes bonding a second semiconductor device to the redistribution structure, wherein the first trench overlaps the second semiconductor device in the plan view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
    a redistribution structure comprising a first dielectric layer and a first conductive element disposed in the first dielectric layer;
    a first semiconductor device bonded to the redistribution structure, wherein the first semiconductor device comprises a first corner;
    a second semiconductor device adjacent to the first semiconductor device, wherein the second semiconductor device comprises a second corner; and
    an underfill disposed over the redistribution structure and comprising a first protrusion extending into the first dielectric layer of the redistribution structure, wherein the first protrusion of the underfill overlaps the first corner of the first semiconductor device and the second corner of the second semiconductor device in a plan view.

2. The package of claim 1, wherein the redistribution structure further comprises:
    a second dielectric layer underlying the first dielectric layer; and
    a second conductive element disposed in the first dielectric layer and the second dielectric layer, wherein the second conductive element is in contact with the first protrusion of the underfill.

3. The package of claim 1, wherein the redistribution structure further comprises a second dielectric layer underlying the first dielectric layer, wherein the first protrusion of the underfill extends into the second dielectric layer.

4. The package of claim 1, wherein an overlapping area of the first protrusion of the underfill and the first semiconductor device is less than ⅛ of an area of the first semiconductor device in the plan view.

5. The package of claim 1, wherein the underfill further comprises a second protrusion overlapping a second corner of the first semiconductor device in the plan view.

6. The package of claim 1, further comprising a third semiconductor device disposed adjacent to the first semiconductor device, wherein the underfill further comprises a second protrusion extending into the redistribution structure and overlapping a second corner of the first semiconductor device and a corner of the third semiconductor device in the plan view.

7. The package of claim 1, wherein a top surface of a first portion of the underfill directly located on the first protrusion of the underfill is lower than a top surface of a second portion of the underfill that is offset from the first protrusion of the underfill in the plan view.

8. A package, comprising:
a first semiconductor device bonded to a redistribution structure;
a second semiconductor device bonded to the redistribution structure, the second semiconductor device being on a first side of the first semiconductor device in a plan view;
a third semiconductor device bonded to the redistribution structure, the third semiconductor device being on the first side of the first semiconductor device; and
an underfill disposed on the redistribution structure and comprising a first protrusion extending into the redistribution structure, wherein the first protrusion of the underfill overlaps a corner of the second semiconductor device in the plan view, wherein the corner of the second semiconductor device faces away from the first semiconductor device and the third semiconductor device, wherein corners of the first semiconductor device are free of overlapping protrusions of the underfill.

9. The package of claim 8, wherein the first protrusion of the underfill further extends to overlap the first semiconductor device in the plan view.

10. The package of claim 8, further comprising a fourth semiconductor device bonded to the redistribution structure and disposed on a second side of the first semiconductor device, the second side of the first semiconductor device being adjacent to the first side of the first semiconductor device, wherein the first protrusion of the underfill overlaps a corner of the fourth semiconductor device in the plan view.

11. The package of claim 10, wherein the corner of the fourth semiconductor device is disposed between a first line comprising a first sidewall and a second line comprising a second sidewall opposite the first sidewall of the second semiconductor device.

12. The package of claim 11, further comprising a fifth semiconductor device bonded to the redistribution structure, wherein the fifth semiconductor device is on a same side of the first semiconductor device as the fourth semiconductor device, wherein the underfill further comprises a second protrusion extending into the redistribution structure, wherein the second protrusion of the underfill overlaps adjacent outer corners of the fourth semiconductor device and the fifth semiconductor device in the plan view, wherein the adjacent outer corners face away from the first semiconductor device.

13. The package of claim 12, wherein the second protrusion of the underfill overlaps a sidewall of the first semiconductor device in the plan view.

14. The package of claim 8, wherein the underfill further comprises a second protrusion extending into the redistribution structure, wherein the second protrusion of the underfill overlaps the second semiconductor device and the third semiconductor device in the plan view.

15. A method of forming a package, the method comprising:
forming a redistribution structure on a carrier, wherein the redistribution structure comprises a first dielectric layer and a conductive element, the first dielectric layer having a first trench and a second trench, wherein a depth of the first trench is different than a depth of the second trench;
bonding a first semiconductor device to the redistribution structure, wherein a corner of the first semiconductor device overlaps the first trench of the redistribution structure in a plan view; and
forming an underfill on the redistribution structure, wherein the underfill is in contact with sidewalls of the first semiconductor device, wherein the underfill fills the first trench and the second trench of the first dielectric layer.

16. The method of claim 15, wherein forming the redistribution structure comprises:
forming the first dielectric layer on the carrier;
patterning the first dielectric layer to form an opening and the first trench in the first dielectric layer;
forming a mask layer covering the first trench and exposing the opening;
forming the conductive element in the opening; and
removing the mask layer.

17. The method of claim 16, wherein forming the redistribution structure further comprises:
forming a second dielectric layer on the carrier before forming the first dielectric layer; and
etching the second dielectric layer from the first trench in the first dielectric layer after removing the mask layer.

18. The method of claim 15, wherein forming the redistribution structure comprises:
forming a second dielectric layer on the carrier;
forming the first dielectric layer on the second dielectric layer;
patterning the first dielectric layer to form an opening in the first dielectric layer;
forming the conductive element in the opening;
forming a mask layer covering the conductive element;
etching the first dielectric layer and the second dielectric layer to form the first trench; and
removing the mask layer.

19. The method of claim 15, further comprising bonding a second semiconductor device to the redistribution structure, wherein the first trench overlaps the second semiconductor device in the plan view.

20. The package of claim 1, wherein the underfill comprises a second protrusion extending into the first dielectric layer, wherein the second protrusion of the underfill overlaps a second corner of the first semiconductor device, wherein a depth of the first protrusion is different than a depth of the second protrusion.

* * * * *